(12) United States Patent
Konishi et al.

(10) Patent No.: US 12,154,976 B2
(45) Date of Patent: Nov. 26, 2024

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Kazuya Konishi, Tokyo (JP); Shinya Soneda, Tokyo (JP); Tetsuya Nitta, Tokyo (JP); Akihiko Furukawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 546 days.

(21) Appl. No.: 17/491,686

(22) Filed: Oct. 1, 2021

(65) Prior Publication Data

US 2022/0190146 A1    Jun. 16, 2022

(30) Foreign Application Priority Data

Dec. 14, 2020 (JP) ................. 2020-206617

(51) Int. Cl.
*H01L 29/739* (2006.01)
*H01L 29/861* (2006.01)

(52) U.S. Cl.
CPC ........ *H01L 29/7397* (2013.01); *H01L 29/861* (2013.01)

(58) Field of Classification Search
CPC .......................... H01L 29/7397; H01L 29/861
USPC .......................................................... 257/139
See application file for complete search history.

(56) References Cited

U.S. PATENT DOCUMENTS

| 2012/0181575 | A1* | 7/2012 | Pfirsch | H01L 29/0696 257/E29.197 |
| 2012/0313139 | A1 | 12/2012 | Matsuura et al. | |
| 2014/0077256 | A1* | 3/2014 | Hikasa | H01L 29/7397 257/139 |
| 2015/0171200 | A1* | 6/2015 | Hikasa | H01L 29/1095 257/139 |

(Continued)

FOREIGN PATENT DOCUMENTS

| JP | 2006059940 A | * | 3/2006 |
| JP | 2012-104680 A | | 5/2012 |

(Continued)

OTHER PUBLICATIONS

An Office Action; "Notice of Reasons for Refusal," mailed by the Japanese Patent Office on Nov. 28, 2023, which corresponds to Japanese Patent Application No. 2020-206617 and is related to U.S. Appl. No. 17/491,686; with English language translation.

*Primary Examiner* — Igwe U Anya
(74) *Attorney, Agent, or Firm* — Studebaker & Brackett PC

(57) ABSTRACT

A semiconductor device includes a first contact layer connected to a lower portion of a first trench contact portion and a second contact layer connected to a lower portion of a second trench contact portion. The distance between a first side portion of a first trench and the first trench contact portion is larger than that between a second side portion of the first trench and the second trench contact portion in a plan view, and the first contact layer is separated from the first side portion and the second contact layer is connected to the second side portion in a cross section. With this structure, it is possible to provide a technique for achieving an appropriate channel region.

24 Claims, 42 Drawing Sheets

(56) References Cited

U.S. PATENT DOCUMENTS

| | | | | |
|---|---|---|---|---|
| 2015/0340480 A1* | 11/2015 | Matsuura | ............ | H01L 29/7397 257/144 |
| 2017/0077299 A1 | 3/2017 | Shimizu et al. | | |
| 2017/0263740 A1* | 9/2017 | Onozawa | ............ | H01L 29/0615 |
| 2019/0288071 A1 | 9/2019 | Nishiwaki et al. | | |
| 2020/0066870 A1* | 2/2020 | Thees | ................ | H01L 29/7813 |

FOREIGN PATENT DOCUMENTS

| | | |
|---|---|---|
| JP | 2012-256628 A | 12/2012 |
| JP | 2017-055005 A | 3/2017 |
| JP | 2017-168829 A | 9/2017 |
| JP | 2019-161103 A | 9/2019 |

* cited by examiner

F I G. 3
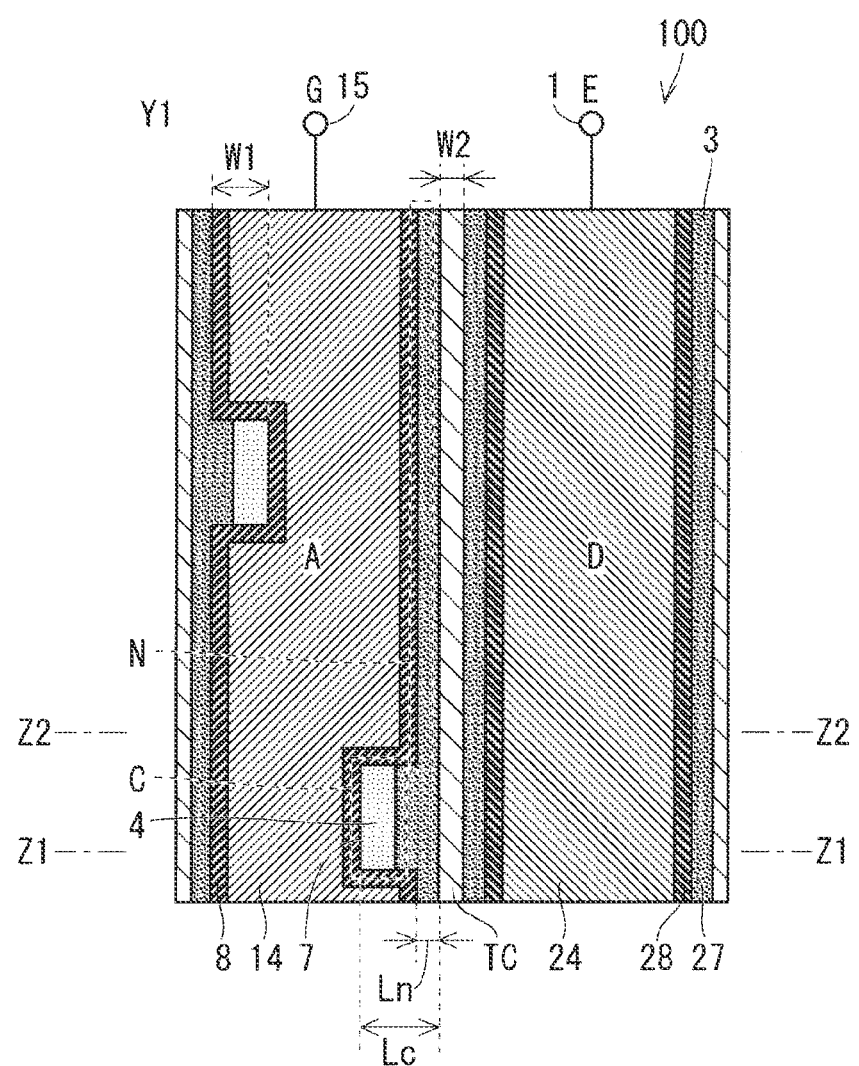

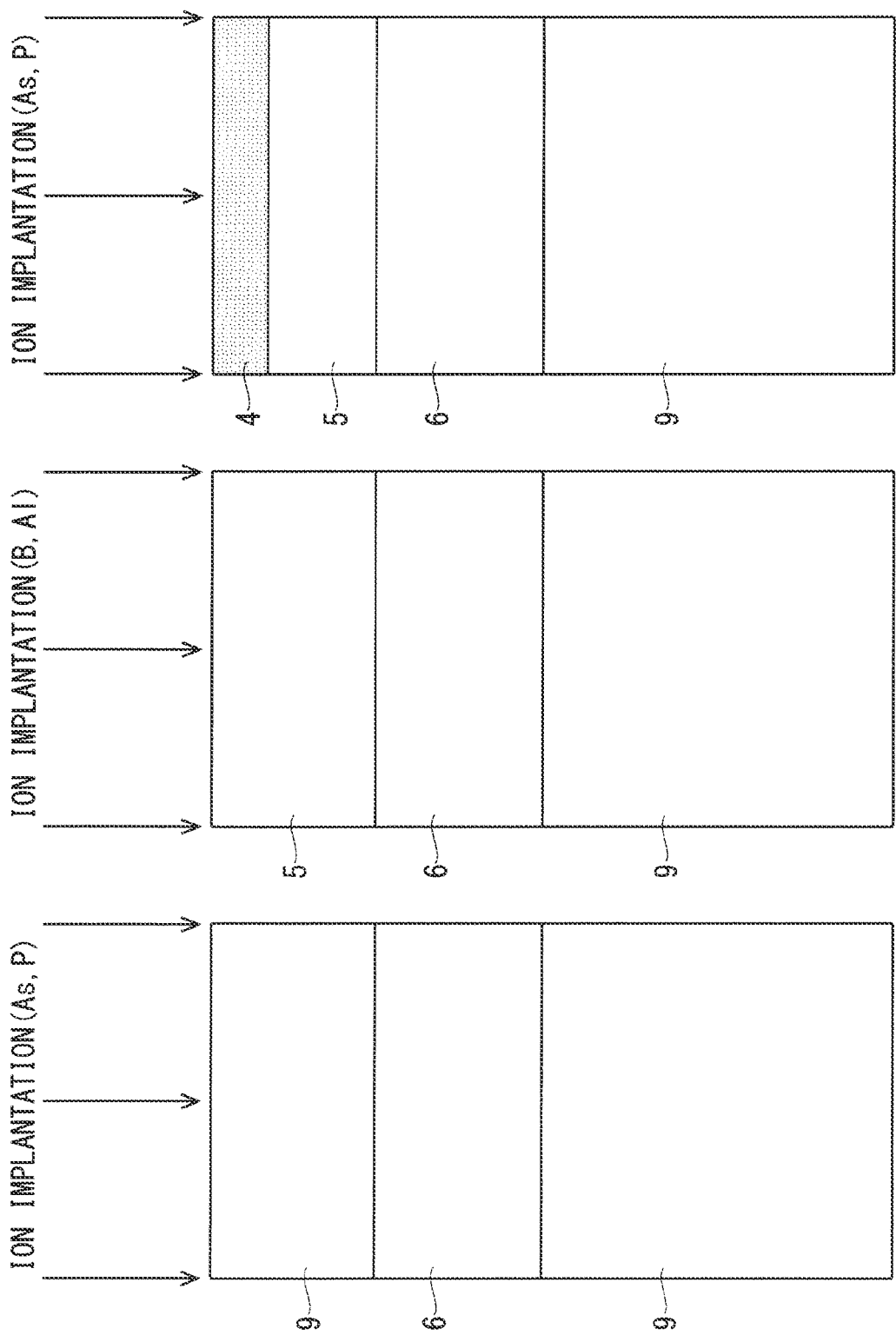

F I G. 8
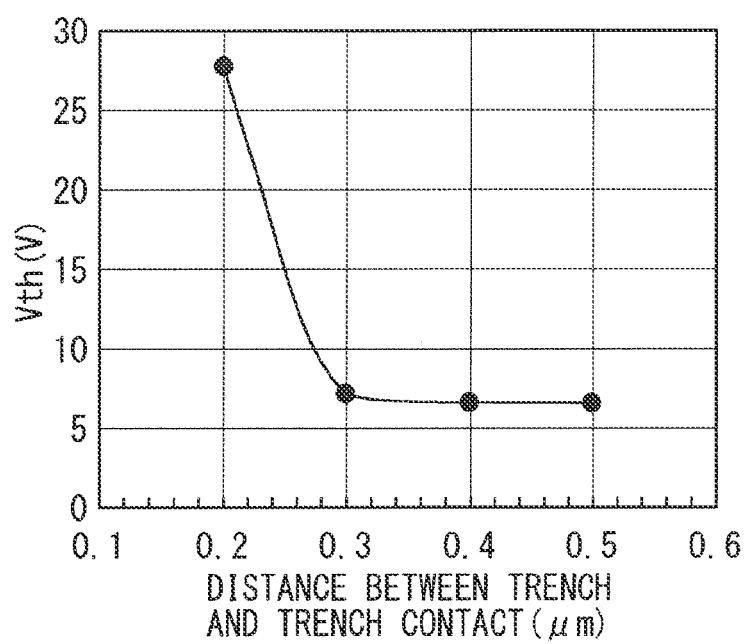

SEMICONDUCTOR DEVICE AND METHOD OF MANUFACTURING SEMICONDUCTOR DEVICE

BACKGROUND OF THE INVENTION

Field of the Invention

The present disclosure relates to a semiconductor device and a method of manufacturing a semiconductor device.

Description of the Background Art

In recent years, proposed has been a technique for manufacturing a semiconductor device by using self-aligned implantation in which the shape of a contact layer is made corresponding to the shape of a trench contact. Since such a technique eliminates the necessity of a mask dedicated to formation of the contact layer, it becomes possible to reduce the manufacturing cost (see Japanese Patent Application Laid Open Gazette No. 2012-256628).

In the semiconductor device manufactured by using the self-aligned implantation, however, since the distance between a trench provided with an active portion connected to a gate electrode and a trench contact is not appropriate, there arises a problem that an appropriate channel region cannot be achieved.

SUMMARY

The present disclosure is intended to solve such a problem as described above, and it is an object of the present invention to provide a technique for achieving an appropriate channel region.

The present invention is intended for a semiconductor device. The semiconductor device according to the present disclosure includes a semiconductor substrate on which an emitter electrode and a gate electrode are provided, a base layer of a first conductivity type which is provided on an upper surface side of the semiconductor substrate, a source layer of a second conductivity type which is provided on the upper surface side of the base layer, an active portion which is provided on an insulating film which is an inner surface of a first trench penetrating the base layer and the source layer, the active portion being connected to the gate electrode, a first trench contact portion and a second trench contact portion provided to face a first side portion and a second side portion of the first trench, respectively, in a plan view, the emitter electrode being provided inside each of the first trench contact portion and the second trench contact portion, a first contact layer of the first conductivity type which is connected to a lower portion of the first trench contact portion and has an impurity concentration of the first conductivity type which is higher than that of the base layer, a second contact layer of the first conductivity type which is connected to a lower portion of the second trench contact portion and has an impurity concentration of the first conductivity type which is higher than that of the base layer, and a collector electrode provided on a lower surface of the semiconductor substrate. The distance between the first side portion and the first trench contact portion is larger than that between the second side portion and the second trench contact portion in a plan view, and the first contact layer is separated from the first side portion and the second contact layer is connected to the second side portion in a cross section.

It is thereby possible to achieve an appropriate channel region.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 3 is a plan view taken along the line Y1-Y1, showing the structure of the semiconductor device in accordance with the first preferred embodiment;

FIGS. 5A to 5C are cross sections each taken along the line Z1-Z1, for explaining a method of manufacturing the semiconductor device in accordance with the first preferred embodiment;

FIG. 8 is a graph showing a relation between the distance between a first trench and a trench contact and a threshold voltage;

DESCRIPTION OF THE PREFERRED EMBODIMENTS

Hereinafter, with reference to attached figures, the preferred embodiments will be described. Characteristic features which will be described in the following preferred embodiments are only examples and not necessarily essential. Further, in the following description, in a plurality of preferred embodiments, identical constituent elements are represented by the same or similar reference signs and different constituent elements will be mainly described. Furthermore, in the following description, specific positions and directions such as "upper", "lower", "left", "right", "front", "back", and the like, may not necessarily coincide with actual directions in practical execution.

Further, description that the concentration in one portion is higher than that in another portion means, for example, that the average concentration in the one portion is higher than that in another portion. Conversely, description that the concentration in one portion is lower than that in another portion means, for example, that the average concentration in the one portion is lower than that in another portion. Further, though the following description will be made by assuming that a first conductivity type is p type and a second conductivity type is n type, there may be a case where the first conductivity type is n type and the second conductivity type is p type. Furthermore, it means that $n^-$ has an impurity concentration lower than that of n and $n^+$ has an impurity concentration higher than that of n. Similarly, it means that $p^-$ has an impurity concentration lower than that of p and $p^+$ has an impurity concentration higher than that of p.

The First Preferred Embodiment

Figure 1:
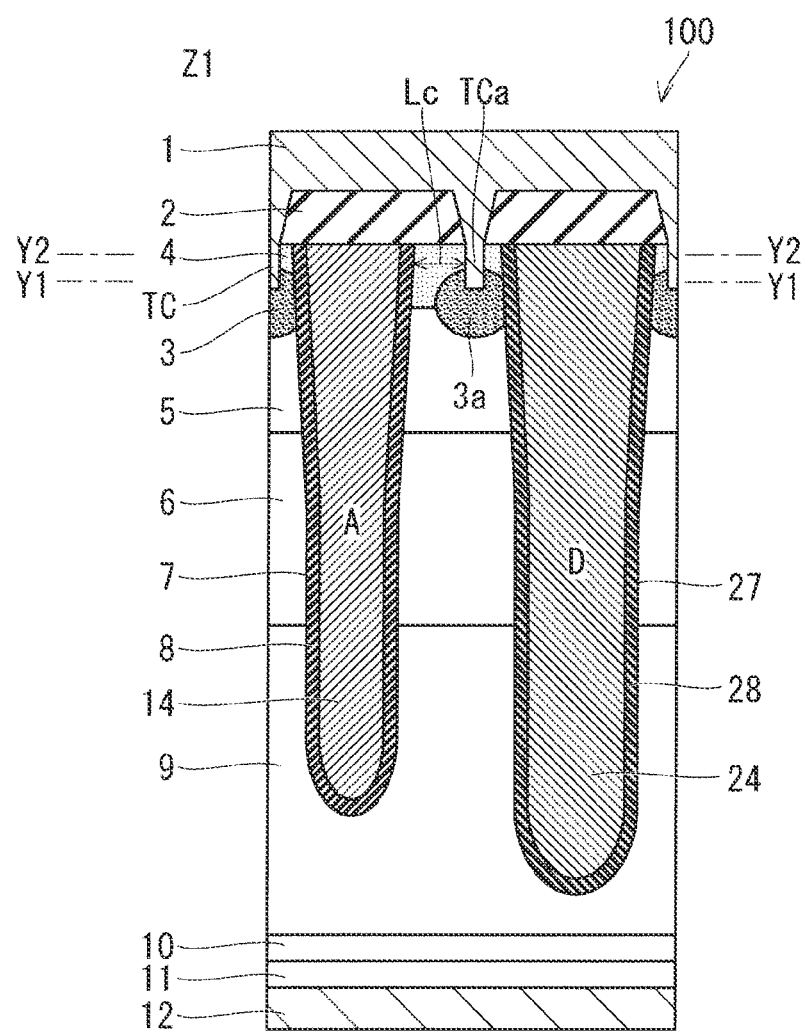
FIG. 1 is a cross section taken along the line Z1-Z1, showing a structure of a semiconductor device in accordance with a first preferred embodiment.
Figure 2:
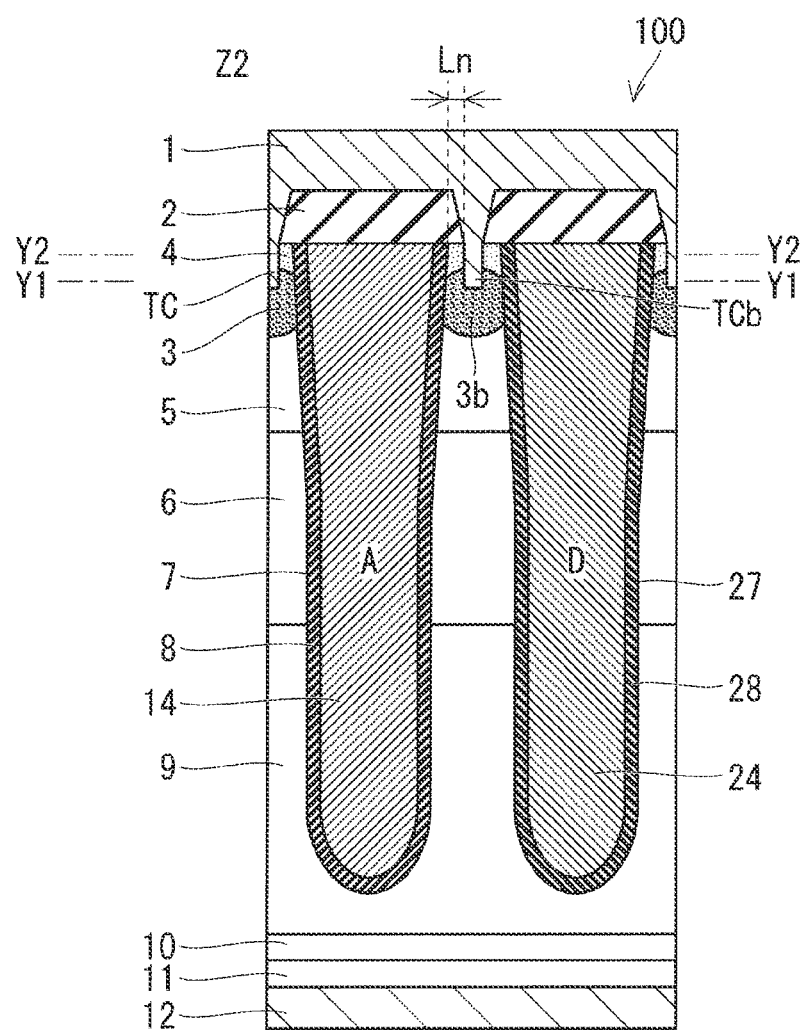
FIG. 2 is a cross section taken along the line Z2-Z2, showing the structure of the semiconductor device in accordance with the first preferred embodiment.
Figure 4:
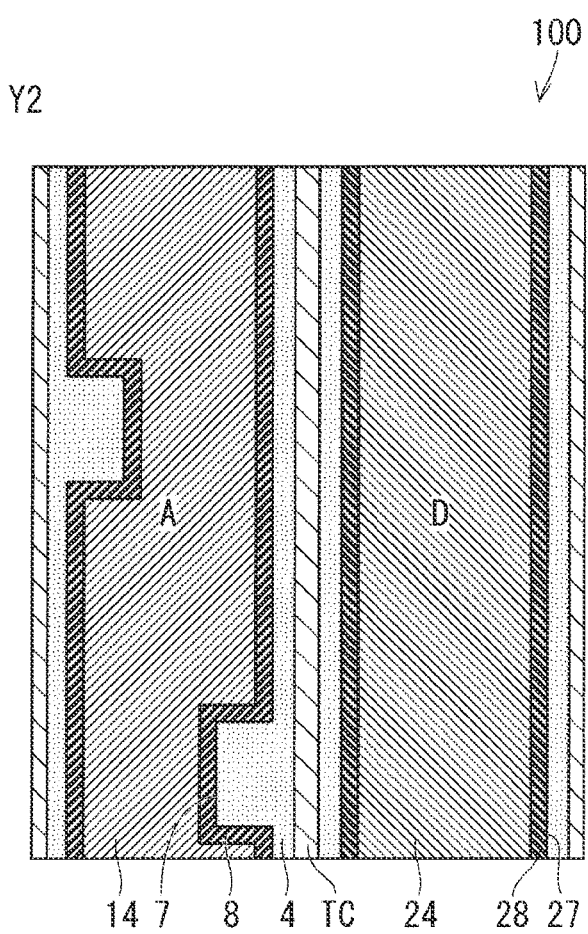
FIG. 4 is a plan view taken along the line Y2-Y2, showing the structure of the semiconductor device in accordance with the first preferred embodiment.

FIGS. 1 and 2 are cross sections each showing a structure of a semiconductor element 100 which is a semiconductor device in accordance with the first preferred embodiment, and FIGS. 3 and 4 are plan views each showing the structure of the semiconductor element 100. Specifically, FIG. 1 is a cross section taken along the line Z1-Z1 of FIG. 3, and FIG. 2 is a cross section taken along the line Z2-Z2 of FIG. 3. FIG. 3 is a plan view taken along the line Y1-Y1 of FIG. 1, and FIG. 4 is a plan view taken along the line Y2-Y2 of FIG. 1.

The description will begin with an overview. As shown in FIGS. 1 to 4, the semiconductor element 100 includes a semiconductor substrate on which an emitter electrode 1 and a gate electrode 15 are provided, and the semiconductor substrate is provided with an active trench A and a dummy trench D. The semiconductor substrate may be formed of a normal semiconductor wafer or may be formed of an epitaxial growth layer. Further, "G" representing the gate electrode 15 and "E" representing the emitter electrode 1 shown in FIG. 3 are sometimes omitted as appropriate in FIG. 5 and the following figures.

As shown in FIGS. 1 and 2, the active trench A is disposed, in which an active portion 14 is provided on a gate oxide film (insulating film) 8 which is an inner surface of a first trench 7 of the semiconductor substrate. The dummy trench D is disposed, in which a dummy portion 24 is provided on an oxide film 28 which is an inner surface of a second trench 27 of the semiconductor substrate.

As shown in FIG. 3, the active trenches A and the dummy trenches D are provided in stripes. The active portion 14 of the active trench A is electrically connected to the gate electrode 15. The dummy portion 24 of the dummy trench D is electrically connected to the emitter electrode 1 provided on a first main surface (upper surface) of the semiconductor substrate.

In the semiconductor device in accordance with the present first preferred embodiment, the active trenches A and the dummy trenches D are arranged alternately. Each of the number of active trenches A and the number of dummy trenches D which are arranged may be one, three, or any other number. Further, the number of dummy trenches D may be zero. In other words, there may be a structure in which no dummy trench D is provided and one or more active trenches A are provided.

As shown in FIGS. 1 and 2, a p-type base layer 5 is provided on an upper surface side of the semiconductor substrate, and on an upper surface side of the p-type base layer 5, provided is an n$^+$-type source layer 4. The n$^+$-type source layer 4 is a semiconductor layer having an n-type impurity such as arsenic, phosphorus, or the like, and the concentration of the n-type impurity is, for example, 1.0 E+17/cm$^3$ to 1.0 E+20/cm$^3$. The first trench 7 penetrates the p-type base layer 5 and the n$^+$-type source layer 4, and the p-type base layer 5 and the n$^+$-type source layer 4 are thereby connected to the active trench A.

As shown in FIGS. 1 and 2, the semiconductor element 100 has an n-type drift layer 9 formed of the semiconductor substrate. In the exemplary case of FIGS. 1 and 2, the semiconductor substrate ranges from the n$^+$-type source layer 4 to a p-type collector layer 11. The n-type drift layer 9 is a semiconductor layer having an n-type impurity such as arsenic, phosphorus, or the like, and the concentration of the n-type impurity is, for example, 1.0 E+12/cm$^3$ to 1.0 E+15/cm$^3$. In FIG. 1, an upper end of the n$^+$-type source layer 4 in this paper is called an upper surface of the semiconductor substrate and a lower end of the p-type collector layer 11 in this paper is called a lower surface (second main surface) of the semiconductor substrate. The upper surface of the semiconductor substrate is a main surface on an upper surface (front surface) side of the semiconductor element 100 and the lower surface of the semiconductor substrate is a main surface on a lower surface (back surface) side of the semiconductor element 100. The semiconductor element 100 has the n-type drift layer 9 between the upper surface and the lower surface.

As shown in FIGS. 1 and 2, on an upper surface side of the n-type drift layer 9, provided is an n-type carrier accumulation layer 6 having an n-type impurity concentration higher than that of the n-type drift layer 9. The n-type carrier accumulation layer 6 is a semiconductor layer having an n-type impurity such as arsenic, phosphorus, or the like, and the concentration of the n-type impurity is, for example, 1.0 E+13/cm$^3$ to 1.0 E+17/cm$^3$. Further, the semiconductor element 100 may have a structure in which no n-type carrier accumulation layer 6 is provided and the n-type drift layer 9 is provided also in a region of the n-type carrier accumulation layer 6 shown in FIGS. 1 and 2. In the structure in which the n-type carrier accumulation layer 6 is provided, it is possible to reduce the conduction loss occurring when currents are carried. Combination of the n-type carrier accumulation layer 6 and the n-type drift layer 9 may be called a drift layer.

The n-type carrier accumulation layer 6 is formed by implanting n-type impurity ions into the semiconductor substrate which forms the n-type drift layer 9 and then performing annealing to diffuse the implanted the n-type impurity in the semiconductor substrate.

On an upper surface side (an upper surface) of the n-type carrier accumulation layer 6, the p-type base layer 5 is provided. The p-type base layer 5 is a semiconductor layer having a p-type impurity such as boron, aluminum, or the like, and the concentration of the p-type impurity is, for example, 1.0 E+12/cm$^3$ to 1.0 E+19/cm$^3$. The p-type base layer 5 is connected to the gate oxide film 8 of the active trench A.

On an upper surface side (an upper surface) of the p-type base layer 5, the n$^+$-type source layer 4 is provided. The n$^+$-type source layer 4 is connected to the gate oxide film 8 of the active trench A. Further, the n$^+$-type source layer 4 forms the upper surface of the semiconductor substrate.

As shown in FIGS. 1 to 4, a trench contact TC is provided to face the first trench 7 in a plan view, and as shown in FIGS. 1 and 2, the emitter electrode 1 is provided inside the trench contact TC.

As shown in FIGS. 3 and 4, the second trench 27 is provided along the first trench 7 in a plan view, and the trench contact TC is sandwiched between the first and second trenches 7 and 27. The second trench 27 is the dummy trench D in the present first preferred embodiment, but may be the active trench A.

The trench contact TC includes a first trench contact portion TCa shown in FIG. 1 and a second trench contact portion TCb shown in FIG. 2. As described later, the first trench contact portion TCa is provided to face a first side portion of the first trench 7 in a plan view, and the first trench contact portion TCa and the first side portion correspond to a channel region C of FIG. 3. On the other hand, the first trench contact portion TCb is provided to face a second side portion of the first trench 7 in a plan view, and the second trench contact portion TCb and the second side portion correspond to a non-channel region N of FIG. 3. Further, the first side portion and the second side portion of the first trench 7 may be included in one end portion of the first trench 7 or may be included in two different end portions thereof. Similarly, the first trench contact portion TCa and the second trench contact portion TCb may be included in one trench contact TC or may be included in two different trench contacts TC.

A p$^+$-type contact layer 3 includes a first p$^+$-type contact layer 3a which is a first contact layer and a second p$^+$-type contact layer 3b which is a second contact layer. The first p$^+$-type contact layer 3a is a semiconductor layer which is connected to a lower portion of the first trench contact portion and has a p-type impurity concentration higher than that of the p-type base layer 5. The second p$^+$-type contact layer 3b is a semiconductor layer which is connected to a lower portion of the second trench contact portion and has a p-type impurity concentration higher than that of the p-type base layer 5. The p-type impurity concentration of the first and second p$^+$-type contact layers 3a and 3b is, for example, 1.0 E+15/cm$^3$ to 1.0 E+20/cm$^3$.

As shown in FIGS. 1 and 2, in the semiconductor element 100, an n-type buffer layer 10 having an n-type impurity concentration higher than that of the n-type drift layer 9 is provided on a lower surface (second main surface) side of the n-type drift layer 9. The n-type buffer layer 10 is provided to suppress a depletion layer extending from the p-type base layer 5 toward a lower surface side from being punched through when the semiconductor element 100 is in an OFF state. The n-type buffer layer 10 may be formed by implanting, for example, phosphorus (P) or proton (H$^+$) or may be formed by implanting both phosphorus (P) and proton (H$^+$). Further, the semiconductor element 100 may have a structure in which no n-type buffer layer 10 is provided and the n-type drift layer 9 is provided also in the region of the n-type buffer layer 10 shown in FIGS. 1 and 2. Combination of the n-type buffer layer 10 and the n-type drift layer 9 may be called a drift layer.

In the semiconductor element 100, the p-type collector layer 11 is provided on a lower surface side of the n-type buffer layer 10. In other words, the p-type collector layer 11 is provided between the n-type drift layer 9 and the lower surface of the semiconductor substrate.

As shown in FIGS. 1 and 2, in the semiconductor element 100, provided is the first trench 7 which extends from the upper surface of the semiconductor substrate, penetrates the p-type base layer 5, and reaches the n-type drift layer 9. Specifically, the first trench 7 penetrates the $n^+$-type source layer 4, the p-type base layer 5, and the n-type carrier accumulation layer 6. The active trench A is formed, in which the active portion 14 is provided inside the first trench 7 with the gate oxide film 8 interposed therebetween.

As shown in FIGS. 1 and 2, an interlayer insulating film 2 is provided on the active portion 14. In the interlayer insulating film 2, a contact hole is provided to expose the trench contact TC. The emitter electrode 1 is provided inside the trench contact TC, on a region in the upper surface of the semiconductor substrate, in which no interlayer insulating film 2 is provided, and on the interlayer insulating film 2.

The emitter electrode 1 is in an ohmic contact with the $n^+$-type source layer 4, the $p^+$-type contact layer 3, and the dummy portion 24 and electrically connected to the $n^+$-type source layer 4, the $p^+$-type contact layer 3, and the dummy portion 24. Further, in FIGS. 1 and 2 or in a cross section other than FIG. 1 or 2, the emitter electrode 1 may be in contact with the dummy portion 24, or may be in contact with the dummy portion 24 through a not-shown contact hole provided in the interlayer insulating film 2.

The emitter electrode 1 may be formed of, for example, an aluminum alloy such as an aluminum-silicon alloy (Al—Si based alloy) or the like or may be formed of a metal film having a plurality of layers in which a plating film is formed on an electrode formed of an aluminum alloy by electroless plating or electroplating. The plating film formed by electroless plating or electroplating may be, for example, a nickel (Ni) plating film. Further, in a case where there is a fine region between adjacent interlayer insulating films 2, or the like, in which the emitter electrode 1 cannot achieve excellent embeddability, there may be a structure in which a tungsten film which can achieve embeddability better than that of the emitter electrode 1 is disposed in the fine region and the emitter electrode 1 is provided on the tungsten film.

Furthermore, a barrier metal may be provided between the interlayer insulating film 2 and the emitter electrode 1. The barrier metal may be, for example, a conductor containing titanium (Ti), such as titanium nitride, or may be TiSi which is an alloy of titanium and silicon (Si). Further, the barrier metal may be provided only on an n-type semiconductor layer such as the $n^+$-type source layer 4 or the like. Combination of the barrier metal and the emitter electrode 1 may be called an emitter electrode.

On a lower surface side of the p-type collector layer 11, a collector electrode 12 is provided. The collector electrode 12 may be formed of an aluminum alloy, like the emitter electrode 1, may be formed of an aluminum alloy and a plating film, or may be formed of any material other than those for the emitter electrode 1. The collector electrode 12 is in an ohmic contact with the p-type collector layer 11 and electrically connected to the p-type collector layer 11.

Then, as shown in FIGS. 1 to 4, the emitter electrode 1 is provided inside the first and second trench contact portions TCa and TCb which are shallower than the first trench 7 and each have a width smaller than that of the first trench 7. The first and second $p^+$-type contact layers 3a and 3b are connected to the lower portions of the first and second trench contact portions TCa and TCb, respectively.

As shown in FIG. 3, in a plan view, the distance Lc between the first side portion of the first trench 7 and the first trench contact portion TCa is larger than the distance Ln between the second side portion of the first trench 7 and the second trench contact portion TCb. Further, the distance used herein is a distance in a direction crossing an extension direction (hereinafter, sometimes referred to as an "extension crossing direction") of the first trench 7. In the present first preferred embodiment, by making the width of the first trench 7 in the first side portion smaller than that of the first trench 7 in the second side portion in a plan view, in other words, by making the width of the first trench 7 partially smaller, the above-described distances Lc and Ln are set.

As shown in FIG. 1, in a cross section, the first $p^+$-type contact layer 3a connected to the lower portion of the first trench contact portion TCa is separated from the first side portion of the first trench 7. Specifically, the p-type base layer 5 and the $n^+$-type source layer 4 which are adjacent to the first side portion of the first trench 7 are connected to each other. This region becomes the channel region C in which a channel is formed in accordance with the voltage of the active portion 14.

On the other hand, as shown in FIG. 2, in a cross section, the second $p^+$-type contact layer 3b connected to the lower portion of the second trench contact portion TCb is connected to the second side portion of the first trench 7. Specifically, the p-type base layer 5 and the $n^+$-type source layer 4 which are adjacent to the second side portion of the first trench 7 are separated from each other by the second $p^+$-type contact layer 3b. This region becomes the non-channel region N in which no channel is formed in accordance with the voltage of the active portion 14.

In other words, by changing the width of the first trench 7 in the extension crossing direction, the non-channel region N is provided in a region where the distance between the first trench 7 and the trench contact TC is relatively small and the channel region C is provided in another region where the distance between the first trench 7 and the trench contact TC is relatively large. According to such a structure, regardless of the pattern of the $n^+$-type source layer 4, the channel region C and the non-channel region N can be controlled depending on whether or not the $p^+$-type contact layer 3 is in contact with the first trench 7.

Further, according to the above-described structure, by providing the $p^+$-type contact layer 3 at the lower portion of the trench contact TC, it becomes possible to increase the latch-up breakdown voltage. Further, since the distance between the first trench 7 and the trench contact TC is large in the channel region C, it is possible to achieve a channel region C in which an adverse effect on the ON-state characteristics due to the $p^+$-type contact layer 3 is suppressed. Therefore, at least one of reduction in the manufacturing cost due to self-aligned implantation of the $p^+$-type contact layer 3 and reduction in the ON-state voltage due to narrowing of the mesa width can be achieved.

Further, in the present first preferred embodiment, the depth of the first trench 7 in the second side portion in FIG. 2 is larger than that of the first trench 7 in the first side portion in FIG. 1. According to such a structure, since the $p^+$-type contact layer 3 (the second $p^+$-type contact layer 3b) is connected to the first trench 7 which is relatively deep in FIG. 2, it is possible to increase the hole discharge amount in the non-channel region N and increase the latch-up breakdown voltage. Further, the difference in the depth of the first trench 7 as shown in FIGS. 1 and 2 may be formed by using a micro-loading effect, or there may be a structure in which any difference in the depth is not formed by controlling the etching condition or the trench width.

Herein, assumed is a structure, for example, in which the width of the trench contact TC is partially changed. In such a structure, the width between the first trench 7 and the second trench 27 needs to be large, and therefore miniaturization cannot be achieved. Further, also in the case where the trench contact TC is bent, since the width between the first trench 7 and the second trench 27 needs to be large, miniaturization cannot be achieved.

In contrast to this, in the present first preferred embodiment, the width of the first trench 7 is partially changed. Generally in a plan view, since the active trench A has a width larger than that of the trench contact TC, the active trench A has a large margin of adjustment in the width, and even when the width is changed to be relatively larger, this change produces a relatively small effect on miniaturization. Therefore, it is possible to achieve both the adjustment of the width and miniaturization.

Further, as shown in FIG. 3, the difference between the width of the first trench 7 in the first side portion and that of the first trench 7 in the second side portion, i.e., the width W1 by which the width of the first trench 7 is reduced, is larger than the width W2 of the trench contact TC (the first and second trench contact portions TCa and TCb).

According to such a structure, it becomes easier to increase the distance Lc while achieving miniaturization. This holds true in the case where the width of the first trench 7 is larger than that of the trench contact TC.

Furthermore, the n$^+$-type source layer 4 may be provided intermittently in stripes in the extension direction of the first trench 7, like in the background art, though not shown in FIG. 3 or 4, or may be provided continuously in the extension direction as shown in FIG. 4.

<Manufacturing Method>

Next, an exemplary method of manufacturing a semiconductor element in accordance with the present first preferred embodiment will be described. Though a method of manufacturing the structure shown in the cross section of FIG. 1 will be mainly described in the following description, the same applies to a method of manufacturing the structure shown in the cross section of FIG. 2. Further, though a method of manufacturing the structure of the first trench 7 shown in FIG. 1 will be mainly described in the following description, almost the same applies to a method of manufacturing the structure of the second trench 27.

First, a semiconductor substrate for forming the n-type drift layer 9 is prepared. As the semiconductor substrate, for example, an n-type wafer containing an n-type impurity, such as an FZ wafer manufactured by the FZ (Floating Zone) method, an MCZ wafer manufactured by the MCZ (Magnetic-field applied CZochralski) method, or the like may be used.

The concentration of the n-type impurity contained in the semiconductor substrate is selected as appropriate depending on the breakdown voltage of a semiconductor device to be manufactured. In the semiconductor device having a breakdown voltage of 1200 V, for example, the concentration of the n-type impurity is adjusted so that the specific resistance of the n-type drift layer 9 forming the semiconductor substrate may be about 40 to 120 Ω·cm. In a process of preparing the semiconductor substrate, the entire semiconductor substrate is the n-type drift layer 9. From the upper surface side or the lower surface side of such a semiconductor substrate, p-type or n-type impurity ions described below are implanted and then diffused into the semiconductor substrate by thermal processing or the like, and a p-type or n-type semiconductor layer is thereby formed in the semiconductor substrate and thus, the semiconductor element 100 is manufactured.

Though not shown, around a cell region in which the semiconductor element 100 is provided, a region which is to become a termination region is provided. Hereinafter, though a method of manufacturing a structure of the cell region of the semiconductor element 100 will be mainly described, the termination region of the semiconductor element 100 may be manufactured by using a well-known manufacturing method. For example, in the termination region, a FLR (Field Limiting Ring) having a p-type termination well layer may be formed, as a breakdown voltage holding structure. In this case, the FLR may be formed by implanting the p-type impurity ions into the termination region before processing the cell region of the semiconductor element 100, or the FLR may be formed by implanting the p-type impurity ions into the termination region simultaneously with the implantation of the p-type impurity ions into the cell region of the semiconductor element 100.

Next, as shown in FIG. 5A, by implanting the n-type impurity such as arsenic (As), phosphorus (P), or the like from the upper surface side of the semiconductor substrate, the n-type carrier accumulation layer 6 is formed. Further, as shown in FIG. 5B, by implanting the p-type impurity such as boron (B), aluminum (Al), or the like from the upper surface side of the semiconductor substrate, the p-type base layer 5 is formed. The n-type carrier accumulation layer 6 and the p-type base layer 5 are formed by implanting the impurity ions into the semiconductor substrate and then diffusing the impurity ions therein by thermal processing. Since the n-type impurity or the p-type impurity is implanted after performing mask processing on the upper surface of the semiconductor substrate, the n-type carrier accumulation layer 6 and the p-type base layer 5 are formed selectively on the upper surface side of the semiconductor substrate. Specifically, the n-type carrier accumulation layer 6 and the p-type base layer 5 are formed in the cell region and connected to the p-type termination well layer in the termination region. Further, the mask processing is a process in which a resist is applied onto the semiconductor substrate and an opening is formed in a predetermined region of the resist by using a photolithography technique, to thereby form a mask on the semiconductor substrate, which is used for performing ion implantation or etching in the predetermined region of the semiconductor substrate through the opening.

Next, as shown in FIG. 5C, by implanting the n-type impurity selectively into the upper surface side of the p-type base layer 5 in the cell region through the mask processing, the n$^+$-type source layer 4 is formed. The n-type impurity to be implanted may be, for example, arsenic (As) or phosphorus (P). Further, by using the same mask in the formation of the p-type base layer 5 and the formation of the n$^+$-type source layer 4, to thereby reduce the number of masks, the manufacturing cost may be reduced.

Figure 6C:
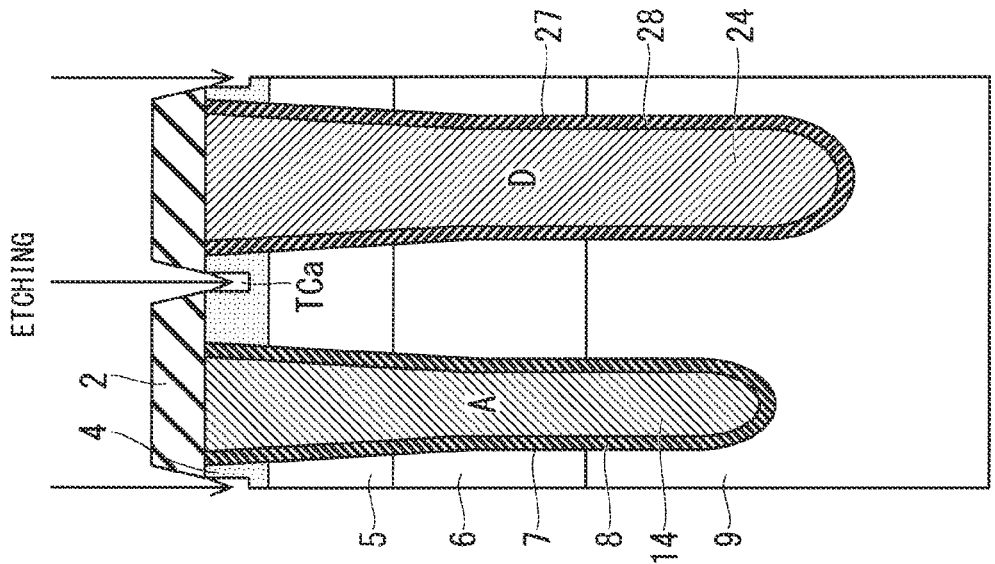
FIGS. 6A to 6C are cross sections each taken along the line Z1-Z1, for explaining the method of manufacturing the semiconductor device in accordance with the first preferred embodiment.
Figure 6B:
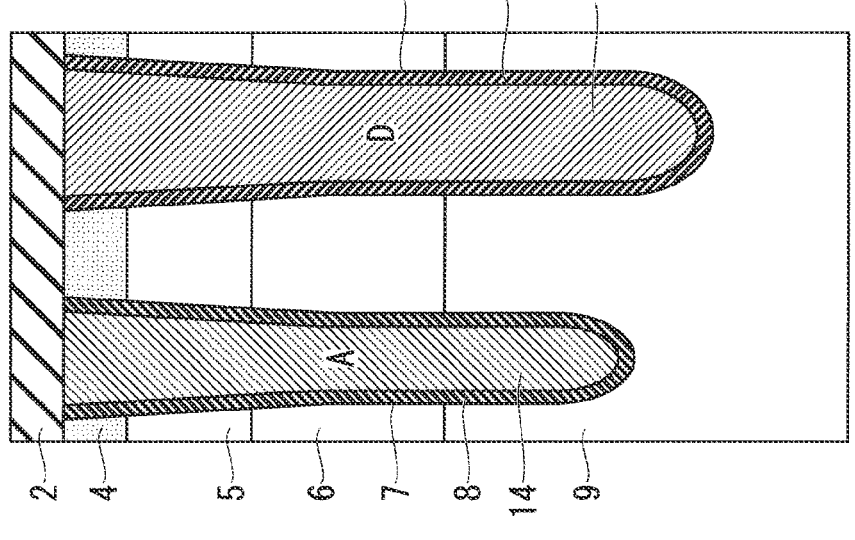
Figure 6A:
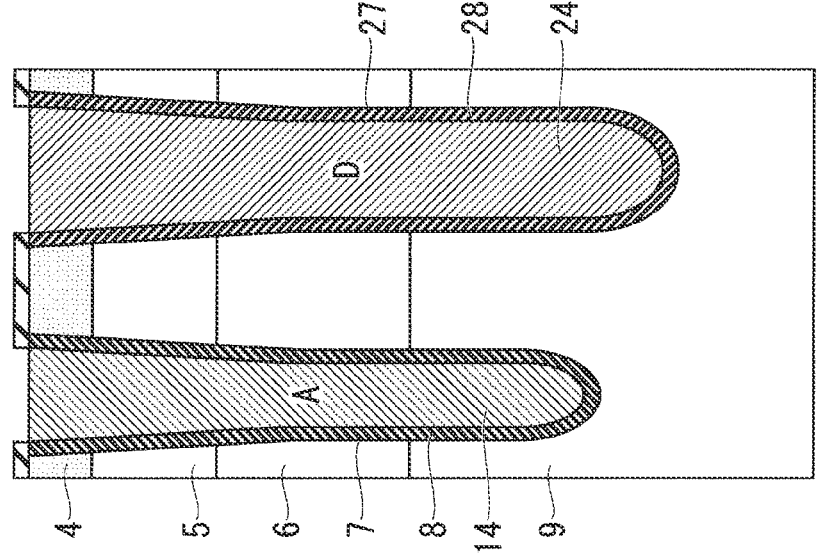

Then, as shown in FIG. 6A, formed is the first trench 7 which penetrates the n$^+$-type source layer 4, the p-type base layer 5, and the n-type carrier accumulation layer 6 from the upper surface side of the semiconductor substrate and reaches the n-type drift layer 9. In the cell region, a sidewall of the first trench 7 penetrating the n$^+$-type source layer 4 is connected to part of the n$^+$-type source layer 4. For example, the first trench 7 is formed through a process in which (i) an oxide film such as SiO$_2$ or the like, serving as a mask, is deposited on the semiconductor substrate, (ii) an opening is formed in a portion of the oxide film, and the first trench 7 is to be formed in the portion, by the mask processing, (iii)

the semiconductor substrate is etched by using the oxide film with the opening formed therein, as a mask.

After that, by heating the semiconductor substrate in an atmosphere containing oxygen, the gate oxide film 8 is formed on the inner surface of the first trench 7 and the upper surface of the semiconductor substrate. The gate oxide film 8 formed on the upper surface of the semiconductor substrate is removed in a post-process.

Next, polysilicon doped with the n-type impurity or the p-type impurity is deposited by CVD (Chemical Vapor Deposition) or the like, inside the first trench 7 where the gate oxide film 8 is formed. Since this polysilicon is to become the active portion 14 and the dummy portion 24, the polysilicon is represented by the reference sings of the active portion 14 and the dummy portion 24 in FIG. 6A and the like.

Next, as shown in FIG. 6B, the interlayer insulating film 2 is formed on the polysilicon in the cell region. The interlayer insulating film 2 may be, for example, $SiO_2$. Then, as shown in FIG. 6C, by the mask processing, a contact hole is formed in the deposited interlayer insulating film 2 and the semiconductor substrate exposed from the contact hole is etched, to thereby form the trench contact TC.

Figure 7A:
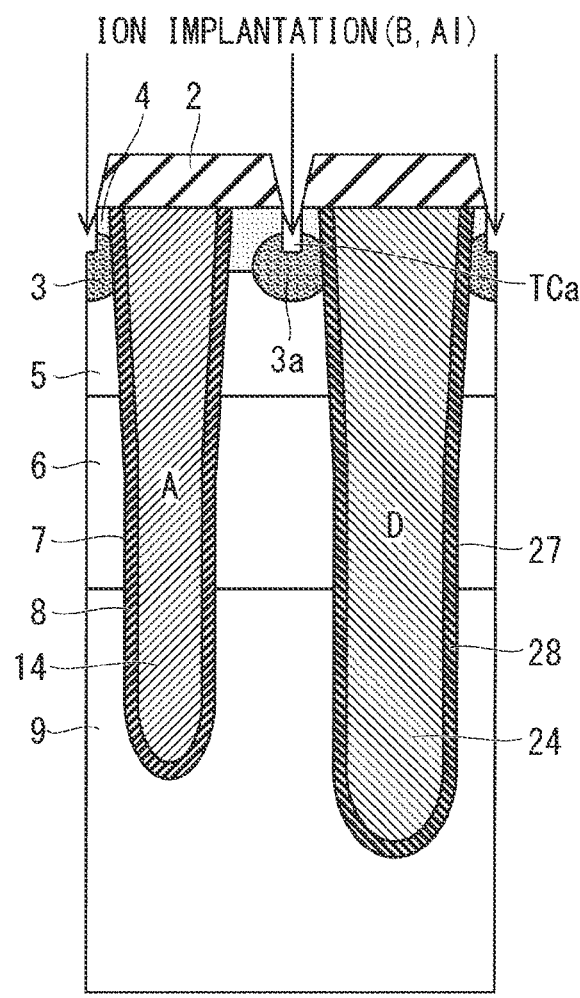
FIGS. 7A and 7B are cross sections each taken along the line Z1-Z1, for explaining the method of manufacturing the semiconductor device in accordance with the first preferred embodiment.

Next, as shown in FIG. 7A, by using the same mask as used for forming the trench contact TC, the p-type impurity such as boron (B), aluminum (Al), or the like is implanted, to thereby form the $p^+$-type contact layer 3. The $p^+$-type contact layer 3 is formed by implanting the impurity ions into the semiconductor substrate and then diffusing the impurity ions therein by thermal processing. Thus, in the present first preferred embodiment, by performing self-aligned implantation into the trench contact TC, the $p^+$-type contact layer 3 is formed. Since the ion implantation for the $p^+$-type contact layer 3 is performed by using the same mask as used for forming the trench contact TC, the $p^+$-type contact layer 3 is formed below the trench contact TC.

Further, after forming the trench contact TC and the $p^+$-type contact layer 3, by extending the contact hole of the interlayer insulating film 2 in a lateral direction by wet etching or the like, the emitter electrode 1 may be formed on the $n^+$-type source layer 4 exposed from the interlayer insulating film 2. According to such a structure, it is possible to increase the contact area between the $n^+$-type source layer 4 and the emitter electrode 1 and reduce the contact resistance.

Figure 7B:
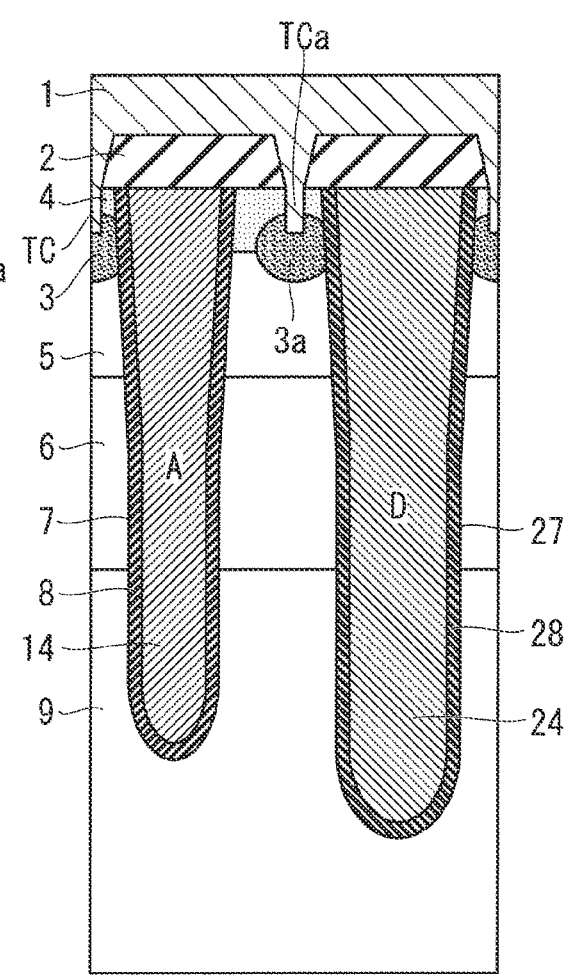

Next, as shown in FIG. 7B, the emitter electrode 1 is formed inside the trench contact TC on the $p^+$-type contact layer 3, on the upper surface of the semiconductor substrate, and on the interlayer insulating film 2. The emitter electrode 1 may be formed, for example, by depositing an aluminum-silicon alloy (Al—Si based alloy) by PVD (Physical Vapor Deposition) such as sputtering, evaporation, or the like. Further, the emitter electrode 1 may be formed by further forming a nickel alloy (Ni alloy) on the aluminum-silicon alloy formed thus, by electroless plating or electroplating. Since a thick metal film can be easily formed as the emitter electrode 1 when the emitter electrode 1 is formed by plating, it is possible to improve the heat resistance due to an increase in the heat capacity of the emitter electrode 1. Further, in the case where the emitter electrode 1 is formed of the aluminum-silicon alloy by PVD and then the nickel alloy is further formed by the plating process, the plating process for forming the nickel alloy may be performed after the processing of the lower surface side of the semiconductor substrate is performed.

Next, the lower surface side of the semiconductor substrate is ground and the semiconductor substrate is thereby thinned to a predetermined designed thickness. The thickness of the semiconductor substrate after the grinding may be, for example, 80 to 200 μm.

Then, by implanting the n-type impurity from the lower surface side of the semiconductor substrate, the n-type buffer layer 10 shown in FIGS. 1 and 2 is formed. Further, by implanting the p-type impurity from the lower surface side of the semiconductor substrate, the p-type collector layer 11 shown in FIGS. 1 and 2 is formed.

The n-type buffer layer 10 may be formed by, for example, implanting phosphorus (P) ions, implanting proton ($H^+$) ions, or implanting both proton and phosphorus. Proton can be implanted into a deep position from the lower surface of the semiconductor substrate with a relatively low acceleration energy. Further, by changing the acceleration energy, it is possible to relatively easily change the implantation depth of proton. For this reason, when the n-type buffer layer 10 is formed of proton, by implanting proton at a plurality of times while changing the acceleration energy, the n-type buffer layer 10 which is thicker in a thickness direction of the semiconductor substrate can be formed, as compared with the case where the n-type buffer layer 10 is formed of phosphorus.

Furthermore, phosphorus has an activation rate higher than that of proton as the n-type impurity. For this reason, even when the semiconductor substrate is thinned, by forming the n-type buffer layer 10 of phosphorus, it is possible to suppress the punch-through of the depletion layer. In order to further thin the semiconductor substrate, it is preferable that the n-type buffer layer 10 should be formed by implanting both proton and phosphorus so that proton can be implanted into a deeper position from the lower surface than phosphorus.

The p-type collector layer 11 may be formed by, for example, implanting boron (B). After ion-implanting boron from the lower surface side of the semiconductor substrate, by irradiating the lower surface with laser to perform laser annealing, the implanted boron is activated and the p-type collector layer 11 is thereby formed. At that time, phosphorus of the n-type buffer layer 10, which is implanted into a relatively shallow position from the lower surface of the semiconductor substrate, is also activated at the same time.

Further, since proton of the n-type buffer layer 10 is activated at a relatively low annealing temperature of 380° C. to 500° C., it is necessary to pay attention so that the temperature of the entire semiconductor substrate should not exceed 380° C. to 500° C. in any process other than the process for activating proton after the implantation of proton. Since the above-described laser annealing can increase the temperature only at the vicinity of the lower surface of the semiconductor substrate, the laser annealing can be used for activating the n-type impurity or the p-type impurity after the implantation of proton.

Next, the collector electrode 12 shown in FIGS. 1 and 2 is formed on the lower surface of the semiconductor substrate. The collector electrode 12 may be formed by depositing an aluminum-silicon alloy (Al—Si based alloy), titanium (Ti), or the like by PVD such as sputtering, evaporation, or the like, or may be formed by laminating a plurality of metals such as an aluminum-silicon alloy, titanium, nickel, gold, or the like. Further, the collector electrode 12 may be formed by further forming a metal film through electroless plating or electroplating, on the metal film formed by the PVD.

By performing the above-described process steps, a plurality of semiconductor elements 100 are manufactured in a matrix on one n-type wafer. The wafer is cut into each piece by laser dicing or blade dicing, to complete the semiconductor element 100.

<Operation>

FIG. 8 is a graph showing a relation between the distance between the first trench 7 and the trench contact TC and a threshold voltage (Vth). As the trench contact TC becomes closer to the first trench 7, since the ratio of the $p^+$-type contact layer 3 below the trench contact TC in the channel region C increases, the threshold voltage (Vth) increases and the ON-state voltage increases. When the above distance is 0.2 μm, particularly, the $p^+$-type contact layer 3 is connected to the first trench 7 and the threshold voltage exceeds 15 V which is a general gate drive voltage, and with the gate drive voltage, no current is carried.

From the above-described tendency, the inventor thought that in order to form a channel in which the adverse effect on the ON-state characteristics due to the $p^+$-type contact layer 3 is suppressed, it is effective that the distance between the first trench 7 and the trench contact TC is made larger in the channel region C and the distance between the first trench 7 and the trench contact TC is made smaller in the non-channel region N. More specifically, the inventor thought of a structure in which the channel region C is provided in the first side portion and the non-channel region N is provided in the second side portion by making the width of the first trench 7 in the first side portion smaller than that of the first trench 7 in the second side portion in a plan view.

According to such a structure, in the non-channel region N, the distance between the trench contact TC and the first trench 7 is relatively small and the gate oxide film 8 of the active trench A is connected to the p-type base layer 5, the $n^+$-type source layer 4, and the $p^+$-type contact layer 3. For this reason, even when the gate drive voltage is applied to the active portion 14, since the $p^+$-type contact layer 3 having a high concentration is connected to the gate oxide film 8 of the active trench A, no channel is formed or a channel is hard to be formed in the non-channel region N.

On the other hand, in the channel region C, the distance between the trench contact TC and the first trench 7 is relatively large and the gate oxide film 8 of the active trench A is connected to the p-type base layer 5 and the $n^+$-type source layer 4 but not connected to the $p^+$-type contact layer 3. For this reason, when the gate drive voltage is applied to the active portion 14, a channel is formed in the p-type base layer 5 which is in contact with the gate oxide film 8 of the active trench A.

In other words, a region in which the $p^+$-type contact layer 3 is not connected to the first trench 7 becomes the channel region C in which a channel is formed, and a region in which the $p^+$-type contact layer 3 is connected to the first trench 7 becomes the non-channel region N in which no channel is substantially formed.

Thus, since the channel region C can be controlled depending on whether or not the $p^+$-type contact layer 3 is connected to the first trench 7, as shown in FIG. 4, the $n^+$-type source layer 4 may be formed across the entire cell region by the self-aligned implantation using the mask for the p-type base layer 5. In this case, it is possible to reduce the number of masks. Further, in order to suppress a short circuit between the $n^+$-type source layer 4 and the n-type drift layer 9, an end portion of the $n^+$-type source layer 4 may be formed to be covered with the p-type base layer 5 which is larger than the $n^+$-type source layer 4.

Summary of the First Preferred Embodiment

In the present first preferred embodiment, by making the width of the first trench 7 partially smaller and making the distance between the first trench 7 and the trench contact TC partially larger, it is possible to achieve the channel region C in which the adverse effect on the ON-state characteristics due to the $p^+$-type contact layer 3 is suppressed. It is thereby possible to achieve at least either the reduction in the manufacturing cost due to the self-aligned implantation of the $p^+$-type contact layer 3 or the reduction in the ON-state voltage due to narrowing of the mesa width.

Further, the channel region C can be controlled depending on whether or not the $p^+$-type contact layer 3 is connected to the first trench 7. For this reason, even when the $n^+$-type source layer 4 is formed across the entire cell region by the self-aligned implantation using the mask for the p-type base layer 5, since the saturation current can be controlled by adjusting the channel density, it is possible to suppress the reduction in the short circuit duration. As this result, it is possible to reduce the manufacturing cost of the $n^+$-type source layer 4.

Furthermore, as shown in FIG. 2, an upper end of the $p^+$-type contact layer 3 (first and second $p^+$-type contact layers 3a and 3b) and a lower end of the $n^+$-type source layer 4 may be connected to each other or may not be connected to each other with the p-type base layer 5 interposed therebetween. In a portion where the upper end of the $p^+$-type contact layer 3 and the lower end of the $n^+$-type source layer 4 are connected to each other, since electron injection from the $n^+$-type source layer 4 is suppressed by the $p^+$-type contact layer 3, it is possible to control the saturation current and suppress the reduction in the short circuit duration. In another portion where the upper end of the $p^+$-type contact layer 3 and the lower end of the $n^+$-type source layer 4 are not connected to each other, it is possible to suppress components of electrons flowing downward from the $n^+$-type source layer 4 through the p-type base layer 5 by the $p^+$-type contact layer 3. There are some cases, however, where the saturation current cannot be controlled since other components of the electrons flowing in the p-type base layer 5 from the $n^+$-type source layer 4 toward the extension direction of the first trench 7, instead of flowing downward through the p-type base layer 5, cannot be suppressed and flow into the n-type drift layer 9 through the channel region C in which the $p^+$-type contact layer 3 is not connected to the first trench 7.

<Variation 1-1>

Figure 9:
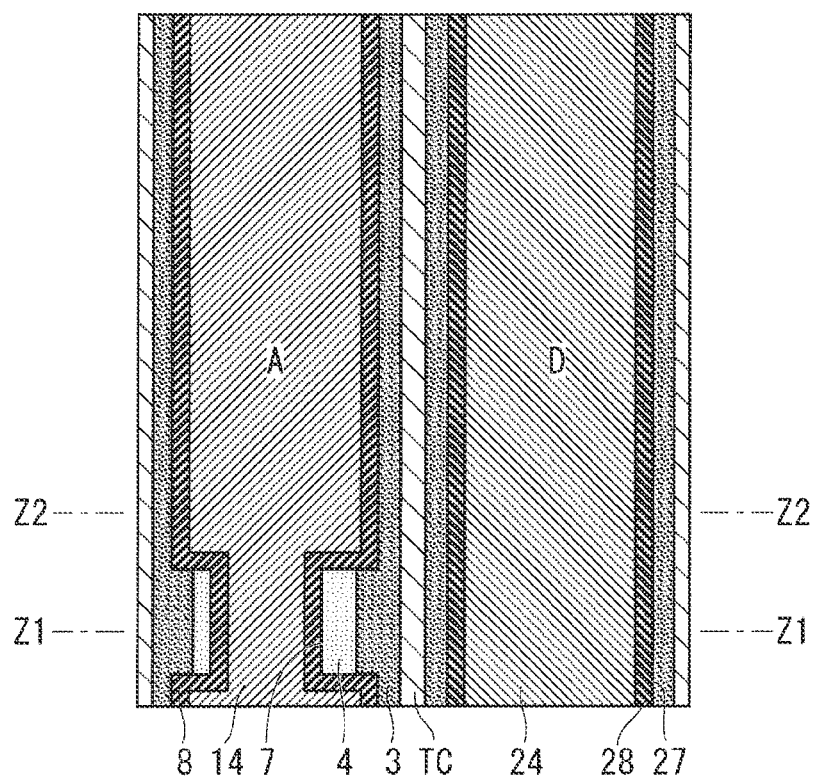
FIG. 9 is a plan view showing a structure of a semiconductor device in accordance with a variation 1-1.

In the first preferred embodiment, though the width of the first trench 7 is made partially smaller by providing the first side portion alternately in one side portion of the first trench 7 and in the other side portion thereof, this is only one exemplary case. As shown in FIG. 9, for example, the width of the first trench 7 may be made smaller from both sides by providing the first side portions in portions facing one side portion of the first trench 7 and the other side portion thereof.

Figure 10:
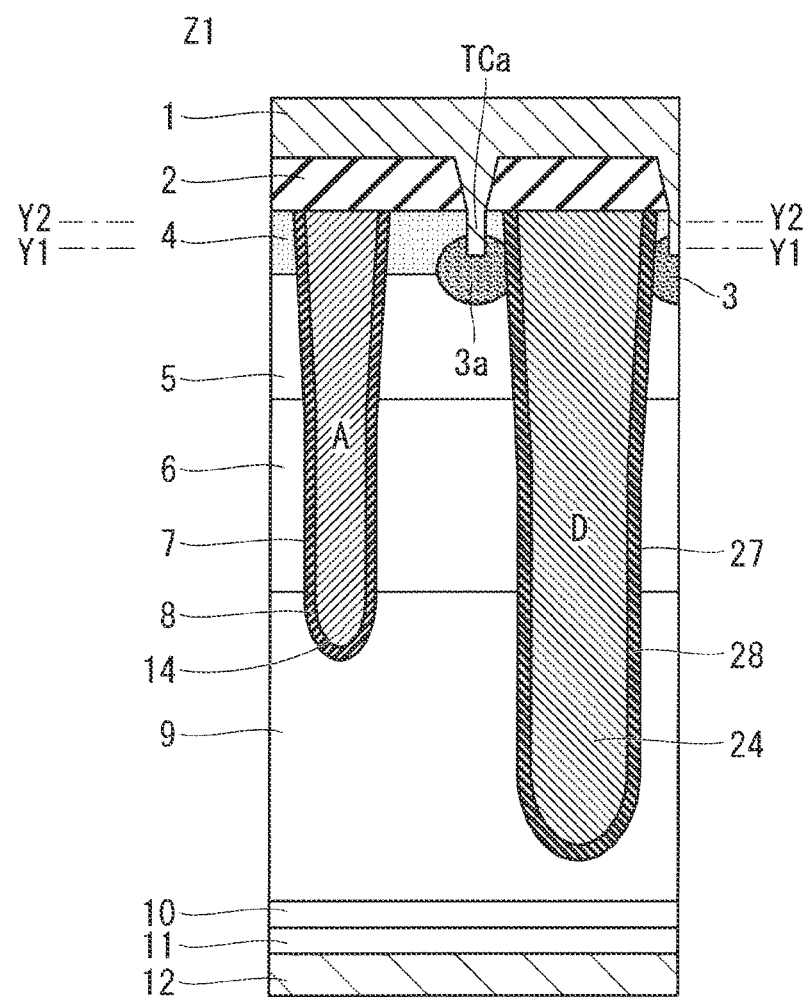
FIG. 10 is a cross section taken along the line Z1-Z1, showing the structure of the semiconductor device in accordance with the variation 1-1.
Figure 11:
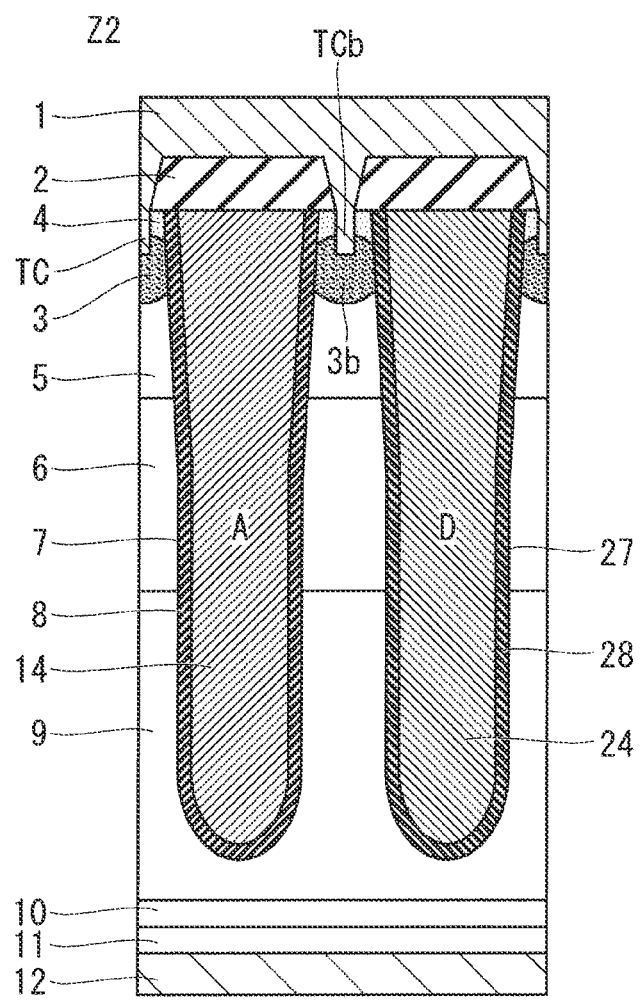
FIG. 11 is a cross section taken along the line Z2-Z2, showing the structure of the semiconductor device in accordance with the variation 1-1.

According to such a structure, the width of the first trench 7 in the extension crossing direction is further reduced. When the width of the first trench 7 becomes smaller, the etching rate becomes slow in a portion where the width of the first trench 7 is small, due to the micro-loading effect. For this reason, the difference between the depth of the first trench 7 in the channel region C shown in FIG. 10 and the depth of the first trench 7 in the non-channel region N shown in FIG. 11 becomes larger than that of the first preferred embodiment. Further, there may be a structure where the difference in the depth is not formed by controlling the etching condition and the trench width.

Furthermore, in order to increase the latch-up breakdown voltage, the potential increase below the $n^+$-type source layer 4 due to the holes has only to be suppressed. In order to achieve this, it is effective that the hole discharge amount is increased in a region where the p$^+$-type contact layer 3 is present below the n$^+$-type source layer 4 and the hole discharge amount is reduced in another region where no p$^+$-type contact layer 3 is present below the n$^+$-type source layer 4. Further, at a turn-off, the holes are discharged through an inversion layer formed on a side surface which is in contact with the n-type drift layer 9 of the active trench A. Since the distance between the side surface of the first trench 7 and the hole to be discharged becomes smaller in the deep first trench 7 as compared with in the shallow first trench 7, the holes are discharged preferentially along the side surface of the deep first trench 7.

A region in which the p$^+$-type contact layer 3 is present below the n$^+$-type source layer 4 adjacent to the deep first trench 7 becomes a region having a high latch-up breakdown voltage. Another region in which the p$^+$-type contact layer 3 is not present below the n$^+$-type source layer 4 adjacent to the shallow first trench 7 becomes a region having a low latch-up breakdown voltage. In the non-channel region N, since the p$^+$-type contact layer 3 is present below the n$^+$-type source layer 4 and the first trench 7 in the non-channel region N is deeper than the first trench 7 in the channel region C, the amount of holes to be discharged along the side surface of the first trench 7 is relatively large.

<Summary of Variation 1-1>

Thus, in the present variation 1-1, by reducing the width of the first trench 7 in the portion facing both the side surfaces of the first trench 7, the first trench 7 becomes deeper in a portion where the width of the first trench 7 is not reduced due to the micro-loading effect. Since the amount of holes to be discharged into the non-channel region N in which the p$^+$-type contact layer 3 is present below the n$^+$-type source layer 4 can be thereby increased, it is possible to increase the latch-up breakdown voltage.

<Variation 1-2>

Figure 12:
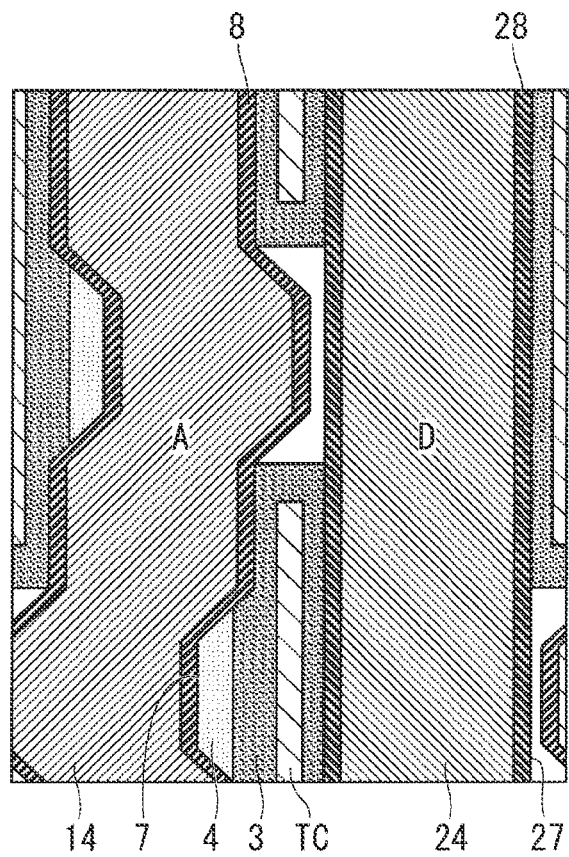
FIG. 12 is a plan view showing a structure of a semiconductor device in accordance with a variation 1-2.

In the first preferred embodiment, though the width of the first trench 7 is reduced, this is only one exemplary case. As shown in FIG. 12, for example, the first trench 7 may be bent to be dented in the first side portion in a plan view. Specifically, the first trench 7 has a concave shape in the first side portion and has a convex shape in a side portion opposite to the first side portion. Preferably, the first trench 7 may be bent so that the width of the first trench 7 may be constant. More preferably, corners of the concave shape and the convex shape may have gentle curvatures in a plan view.

<Summary of Variation 1-2>

By bending the first trench 7 to be dented in the first side portion in a plan view, the width of the first trench 7 can be made substantially constant. It is thereby possible to uniformalize the depth of the first trench 7 without occurrence of the micro-loading effect. Though the electric field is likely to be concentrated at corners of the bottom portion of the deep first trench 7 in the structure where there is a variation in the depth of the first trench 7, according to the structure in which the depth of the first trench 7 is uniformalized as shown in the present variations 1-2, it is possible to alleviate such electric field concentration. Further, with the structure in which the corners of the concave shape and the convex shape of the first trench 7 have gentle curvatures in a plan view, it is possible to alleviate the electric field at the corners of the bottom portion of the first trench 7.

<Variation 1-3>

Figure 13:
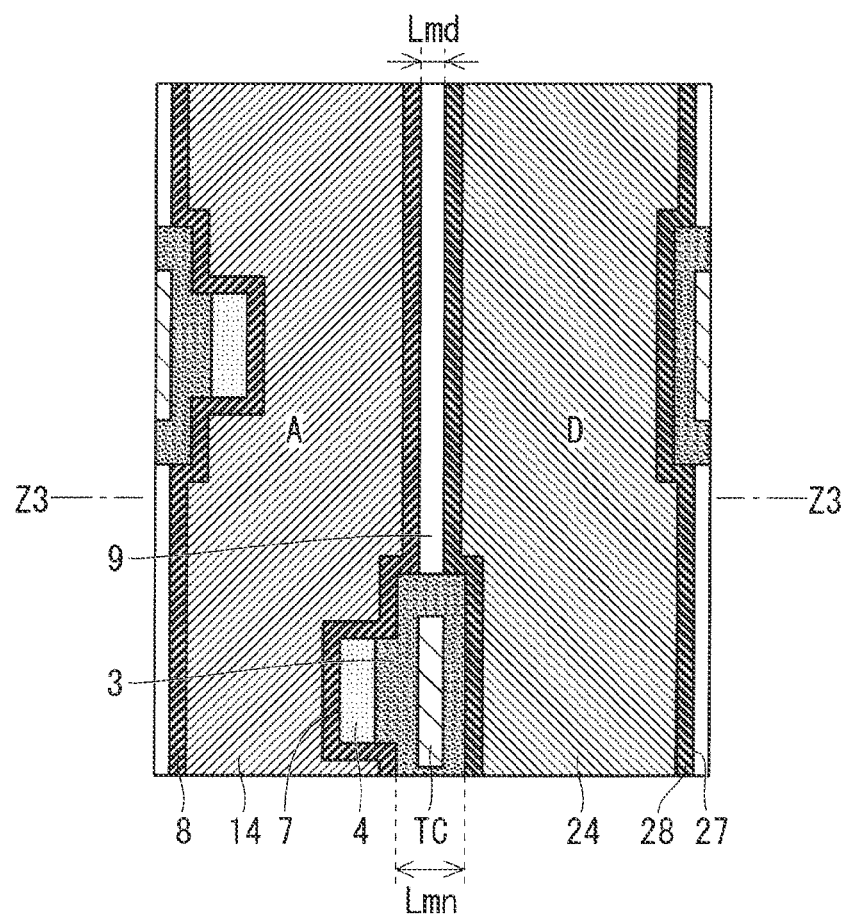
FIG. 13 is a plan view showing a structure of a semiconductor device in accordance with a variation 1-3.
Figure 14:
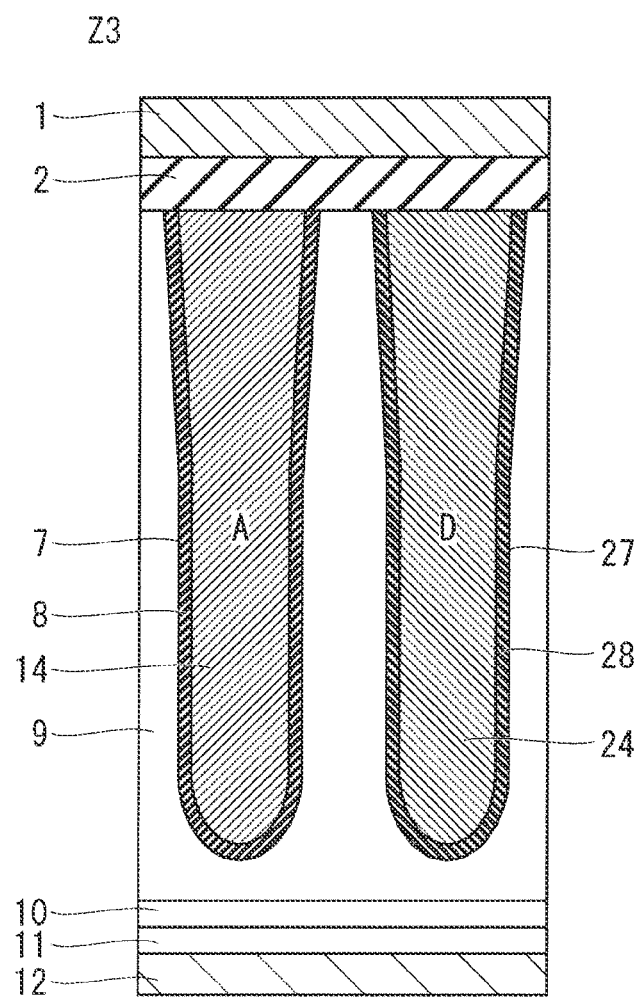
FIG. 14 is a cross section taken along the line Z3-Z3, showing the structure of the semiconductor device in accordance with the variation 1-3.

FIG. 13 is a plan view showing a structure of a semiconductor device of the present variation 1-3, and FIG. 14 is a cross section taken along the line Z3-Z3 of FIG. 13, showing this structure.

Though the trench contact TC is provided to face the entire first trench 7 in the first preferred embodiment, this is only one exemplary case. As shown in FIGS. 13 and 14, for example, the first and second trench contact portions TCa and TCb may be formed not to face a third side portion of the first trench 7 in a plan view. In other words, the trench contact TC is not provided to face the entire first trench 7 but may be provided, being partially thinned out. More preferably, as shown in FIGS. 13 and 14, the mesa width Lmd of the region where the trench contact TC is thinned out may be made smaller than the width Lmn of the region where the trench contact TC is provided. Further preferably, in the region where the trench contact TC is thinned out, the n-type drift layer 9 may be provided, instead of the p-type base layer 5.

<Summary of Variation 1-3>

Since the mesa width of the region where the trench contact TC is thinned out can be reduced, it is possible to increase the carrier accumulation amount and further reduce the ON-state voltage. Further, when the p-type base layer 5 is not provided in the region where the trench contact TC is thinned out, since the amount of holes to be discharged through the p-type base layer 5 can be reduced, it is possible to further reduce the ON-state voltage.

<Variation 1-4>

Figure 15:
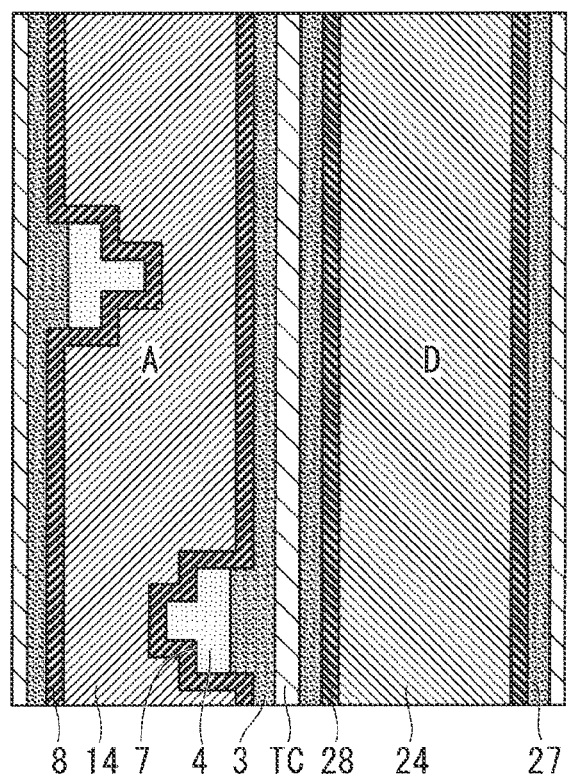
FIG. 15 is a plan view showing a structure of a semiconductor device in accordance with a variation 1-4.

In the first preferred embodiment, though an outline of the first trench 7 in the first side portion has one concave shape in a plan view, this is only one exemplary case. As shown in FIG. 15, for example, the outline of the first trench 7 in the first side portion may have a plurality of concave shapes. Further, the outline of the first trench 7 in the first side portion may have one or more convex shapes or may have combination of one or more concave shapes and one or more convex shapes. Furthermore, though the outline of the first trench 7 along the extension direction thereof has a concave shape in FIG. 15, the outline of the first trench 7 along the extension crossing direction thereof may have at least one of one or more concave shapes and one or more convex shapes.

<Summary of Variation 1-4>

According to the structure described above, since the channel width in the channel region C can be increased, it is possible to increase the current density.

The Second Preferred Embodiment

Figure 16:
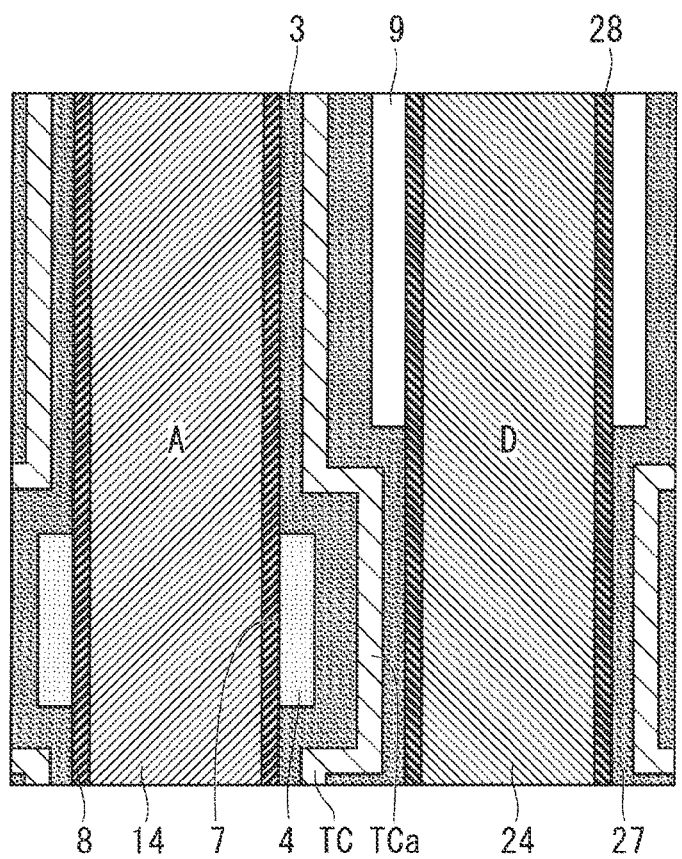
FIG. 16 is a plan view showing a structure of a semiconductor device in accordance with a second preferred embodiment.

In the first preferred embodiment and the variations of the first preferred embodiment, by partially changing the width of the first trench 7 or partially bending the first trench 7, the distance between the first trench 7 and the trench contact TC is partially increased. In contrast to this, in the present second preferred embodiment, as shown in FIG. 16, the trench contact TC including the first trench contact portion TCa is bent toward the opposite side of the first side portion of the first trench 7 in a plan view. In other words, the trench contact TC is partially bent.

Summary of the Second Preferred Embodiment

By bending the trench contact TC, like in the first preferred embodiment, it is possible to partially increase the distance between the first trench 7 (the first side portion) and the trench contact TC (the first trench contact portion TCa). It is thereby possible to achieve the channel region C in which the adverse effect on the ON-state characteristics due to the p$^+$-type contact layer 3 is suppressed. Therefore, it is possible to achieve both the reduction in the manufacturing cost due to the self-aligned implantation of the p$^+$-type contact layer 3 and the reduction in the ON-state voltage due to narrowing of the mesa width at the same time.

Though such an effect can be achieved by partially changing the width of the trench contact TC, the embeddability of the emitter electrode 1 into the portion where the width of the trench contact TC is changed is relatively low. For this reason, there is a limit in increasing the distance between the first side portion of the first trench 7 and the first trench contact portion TCa of the trench contact TC by partially changing the width of the trench contact TC, and there are some cases where the adverse effect on the ON-state characteristics cannot be sufficiently suppressed. In contrast to this, in the structure where the trench contact TC is bent as shown in the present second preferred embodiment, since the limit due to the embeddability of the emitter electrode 1 is alleviated, the distance between the first trench 7 and the trench contact TC can be made sufficiently large, and it is possible to suppress the adverse effect on the ON-state characteristics.

<Variation 2-1>

Figure 17:
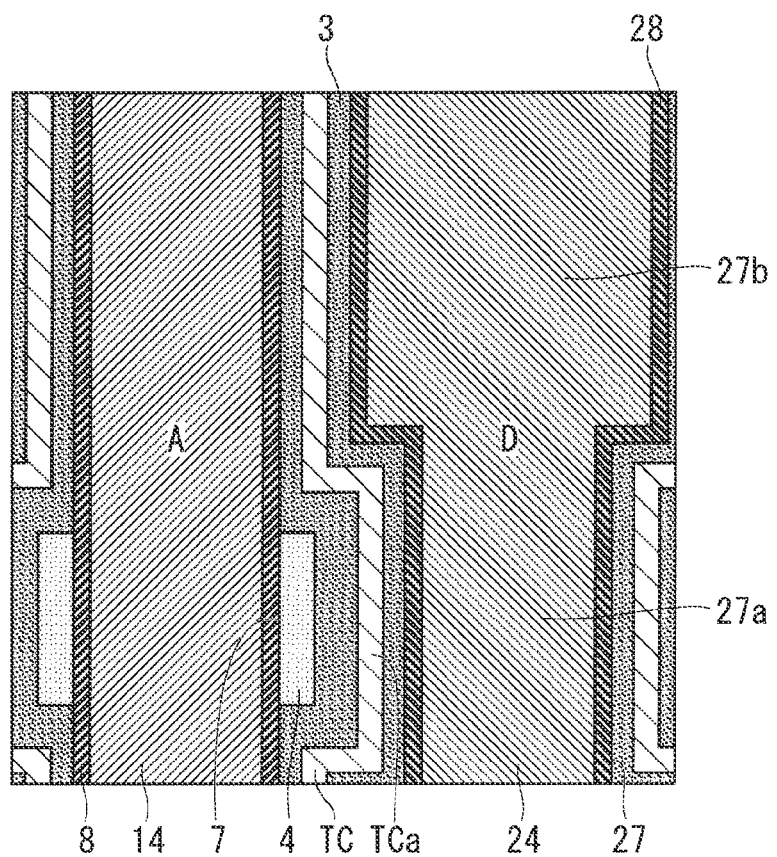
FIG. 17 is a plan view showing a structure of a semiconductor device in accordance with a variation 2-1.

As shown in FIG. 17, the second trench 27 may include a first portion 27a facing the first trench contact portion TCa of the trench contact TC and a second portion 27b facing a portion of the trench contact TC, which is other than the first trench contact portion TCa. Then, the width of the second portion 27b may be larger than that of the first portion 27a. In other words, the width of the second trench 27 adjacent to a portion of the trench contact TC, which is not bent toward the side of the second trench 27, may be increased. Further, the second trench 27 whose width is increased is the dummy trench D in FIG. 17 but may be the active trench A.

<Summary of Variation 2-1>

According to the structure described above, since the mesa width is reduced, it is possible to reduce the ON-state voltage.

<Variation 2-2>

Figure 18:
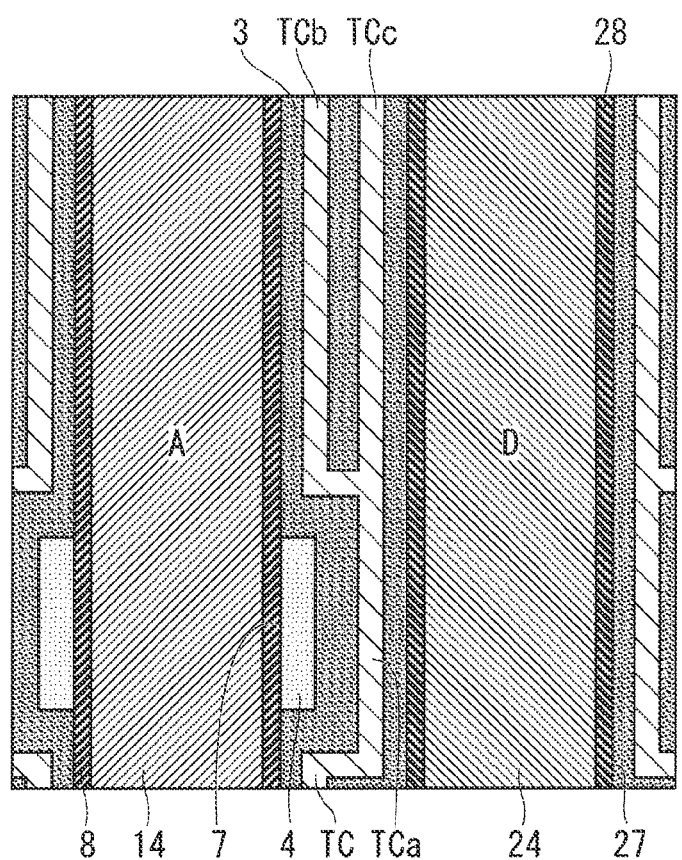
FIG. 18 is a plan view showing a structure of a semiconductor device in accordance with a variation 2-2.
Figure 19:
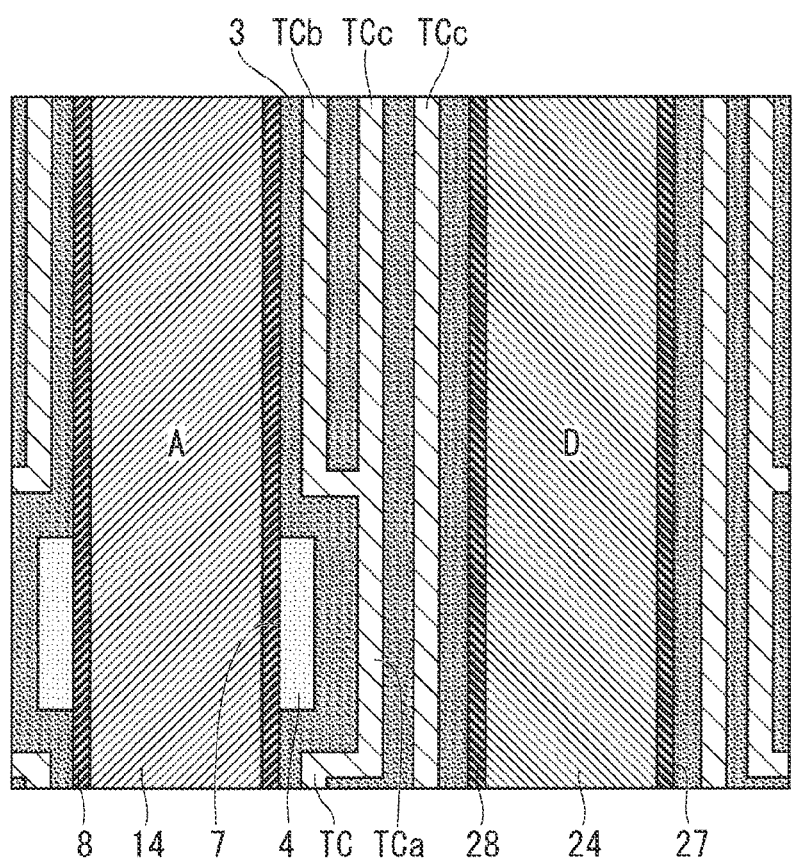
FIG. 19 is a plan view showing the structure of the semiconductor device in accordance with the variation 2-2.

In the second preferred embodiment, though the number of trench contacts TC in the mesa region is one, this is only one exemplary case. As shown in FIG. 18, for example, the number of trench contacts TC in the mesa region may be two, and as shown in FIG. 19, the number of trench contacts TC in the mesa region may be two or more. In other words, the trench contact TC may include a third trench contact portion TCc which is aligned with the first trench contact portion TCa or the second trench contact portion TCb in a width direction, between the first trench 7 and the second trench 27. Further, the number of trench contacts TC adjacent to the non-channel region N may be larger than the number of trench contacts TC adjacent to the channel region C.

<Summary of Variation 2-2>

Since the area of the p$^+$-type contact layer 3 below the trench contact TC can be increased by providing the plurality of trench contacts TC, it is possible to increase the hole discharge amount and the latch-up breakdown voltage.

<Variation 2-3>

Figure 20:
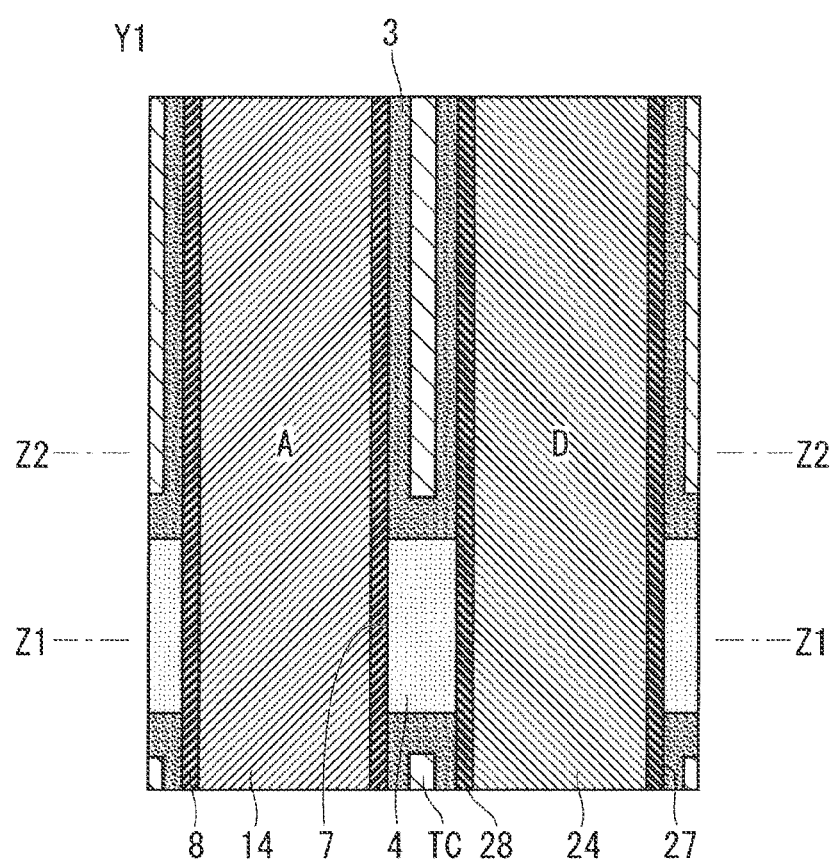
FIG. 20 is a plan view taken along the line Y1-Y1, showing a structure of a semiconductor device in accordance with a variation 2-3.
Figure 21:
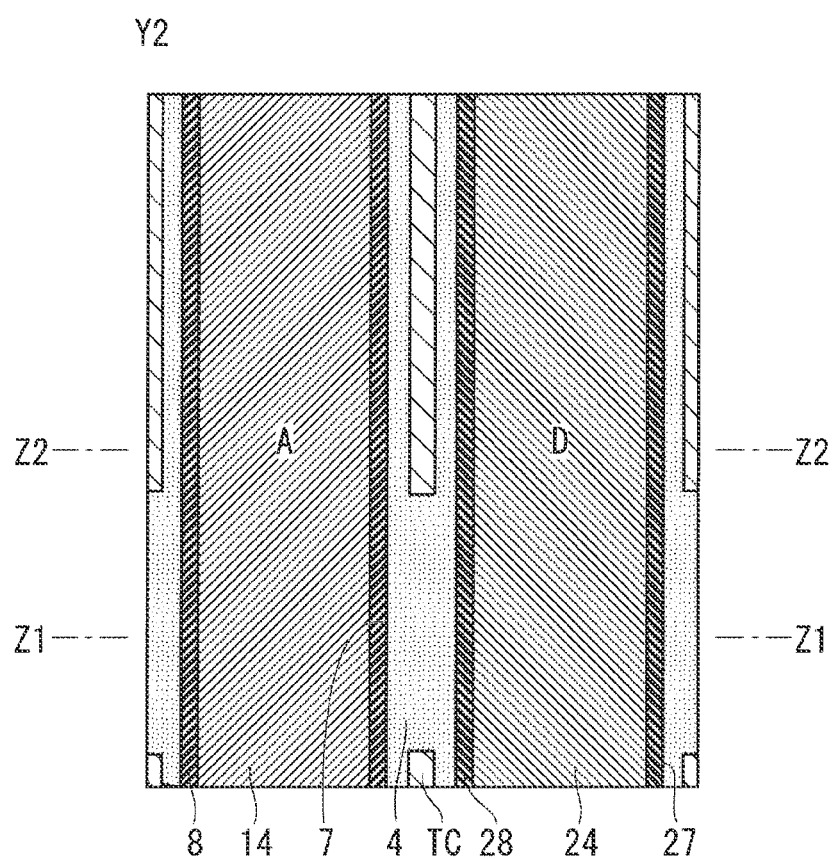
FIG. 21 is a plan view taken along the line Y2-Y2, showing the structure of the semiconductor device in accordance with the variation 2-3.
Figure 22:
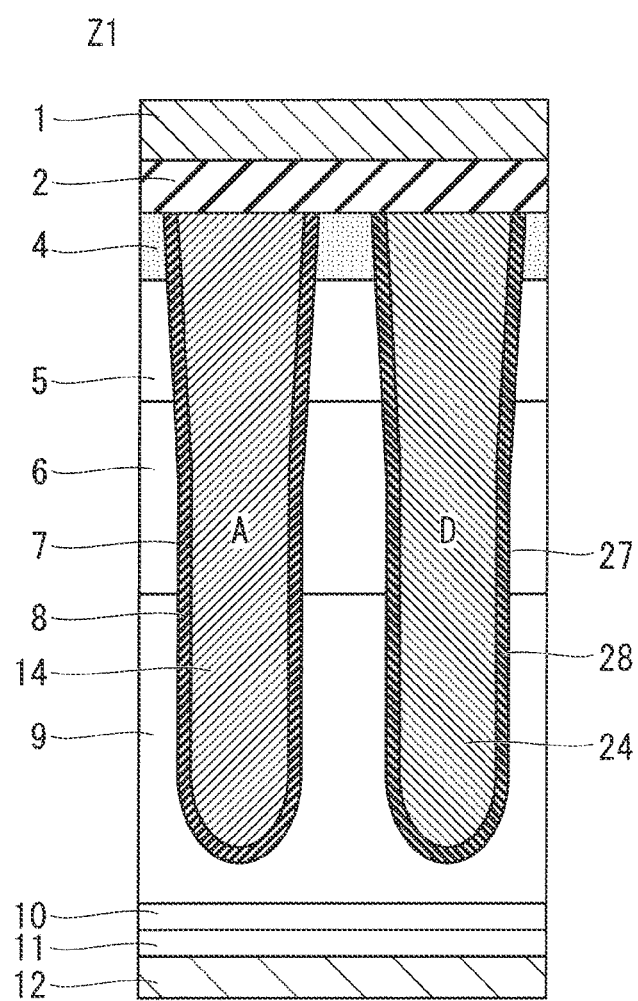
FIG. 22 is a cross section taken along the line Z1-Z1, showing the structure of the semiconductor device in accordance with the variation 2-3.
Figure 23:
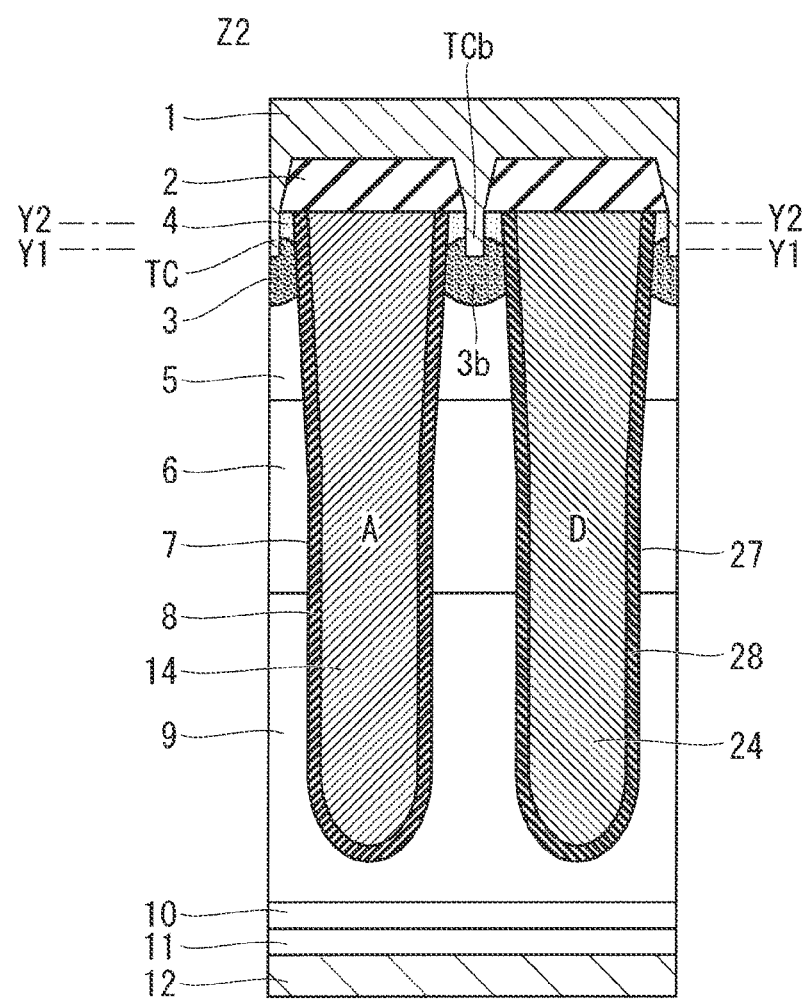
FIG. 23 is a cross section taken along the line Z2-Z2, showing the structure of the semiconductor device in accordance with the variation 2-3.

FIG. 20 is a plan view taken along the line Y1-Y1 of FIG. 23, showing a structure of a semiconductor device in accordance with the present variation 2-3, and FIG. 21 is a plan view taken along the line Y2-Y2 of FIG. 23, showing this structure. FIG. 22 is a cross section taken along the line Z1-Z1 of FIGS. 20 and 21, showing the channel region C. FIG. 23 is a cross section taken along the line Z2-Z2 of FIGS. 20 and 21, showing the non-channel region N.

Though the trench contact TC adjacent to the channel region C is bent in the second preferred embodiment, this is only one exemplary case. As shown in FIGS. 20 to 23, for example, the trench contact TC may be thinned out in the channel region C. In other words, the p-type base layer 5 and the n$^+$-type source layer 4 which are adjacent to the third side portion of the first trench 7 may be connected to each other. The third side portion of the first trench 7 described herein refers to a side portion of the first trench 7 shown in FIG. 22, which is caused not to face the trench contact TC by thinning out the trench contact TC, as described in the variation 1-3. More preferably, as shown in FIGS. 21 and 23, the n$^+$-type source layer 4 may be provided in the non-channel region N. Further preferably, as shown in FIGS. 20 and 23, the p$^+$-type contact layer 3 may be connected to the first trench 7 in the non-channel region N.

<Summary of Variation 2-3>

According to the structure described above, it is possible to further reduce the mesa width by the thinning-out of the trench contact TC. Further, in the case where the n$^+$-type source layer 4 is provided also in the non-channel region N, as shown in FIGS. 21 and 23, the trench contact TC adjacent to the non-channel region N can be in contact with the n$^+$-type source layer 4.

<Variation 2-4>

Figure 24:
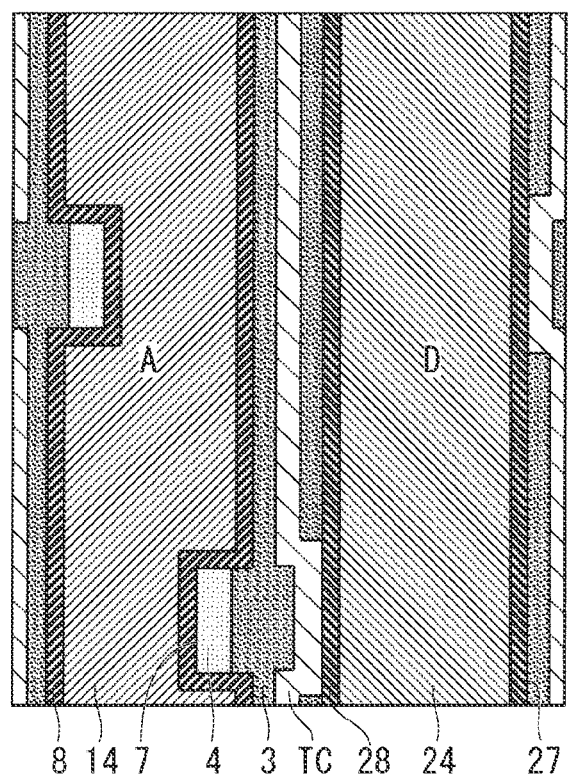
FIG. 24 is a plan view showing a structure of a semiconductor device in accordance with a variation 2-4.
Figure 25:
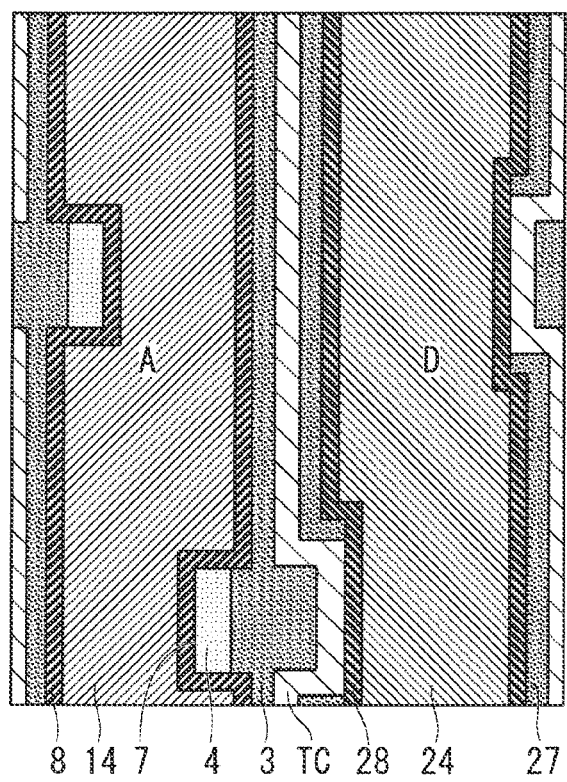
FIG. 25 is a plan view showing the structure of the semiconductor device in accordance with the variation 2-4.

The structure of the first preferred embodiment and that of the second preferred embodiment may be combined. Specifically, as shown in FIG. 24, there may be a structure in which the width of the first trench 7 in the first side portion is smaller than that of the first trench 7 in the second side portion and the trench contact TC is bent toward the opposite side of the first side portion of the first trench 7 in a plan view. Preferably, as shown in FIG. 25, the second trench 27 may be also bent toward the opposite side of the first side portion of the first trench 7, like the trench contact TC.

<Summary of Variation 2-4>

According to the structure described above, since the distance between the first side portion of the first trench 7 and the trench contact TC can be made still larger, it is possible to further suppress the adverse effect on the ON-state characteristics due to the p$^+$-type contact layer 3. Further, in the case, as shown in FIG. 25, where the second trench 27 is also bent toward the opposite side of the first side portion of the first trench 7, like the trench contact TC, it is possible to further suppress the adverse effect on the ON-state characteristics due to the p$^+$-type contact layer 3.

The Third Preferred Embodiment

Figure 26:
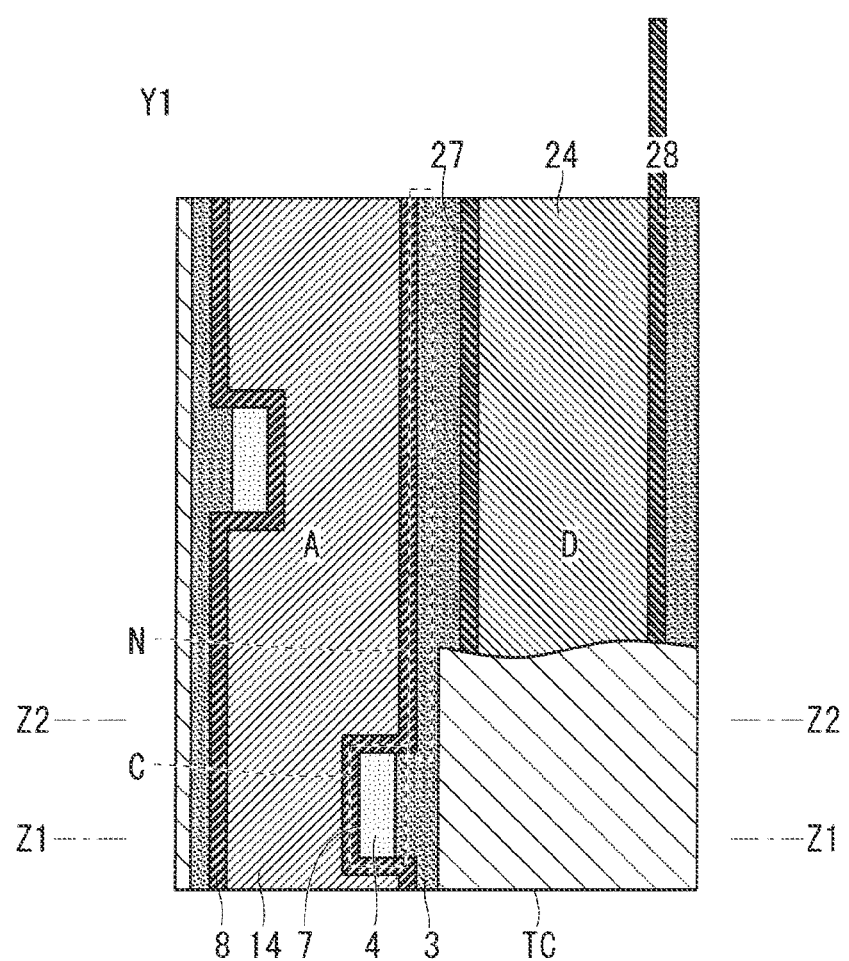
FIG. 26 is a plan view taken along the line Y1-Y1, showing a structure of a semiconductor device in accordance with a third preferred embodiment.
Figure 27:
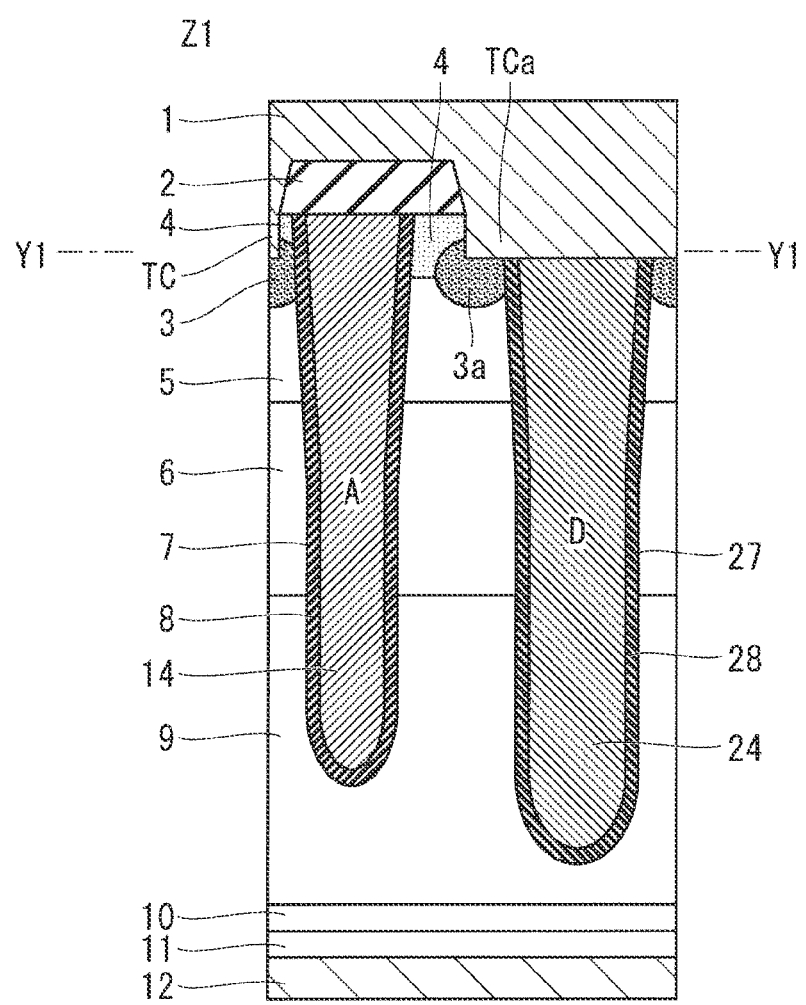
FIG. 27 is a cross section taken along the line Z1-Z1, showing the structure of the semiconductor device in accordance with the third preferred embodiment.
Figure 28:
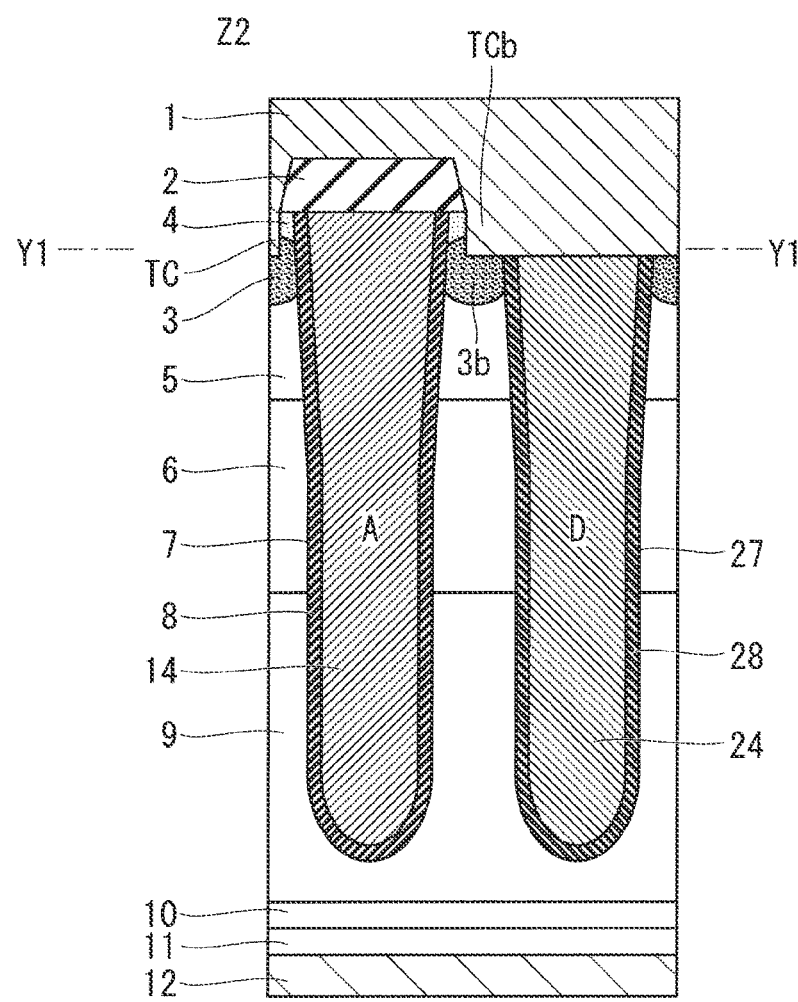
FIG. 28 is a cross section taken along the line Z2-Z2, showing the structure of the semiconductor device in accordance with the third preferred embodiment.

In the first and second preferred embodiments, the trench contact TC is provided in the mesa region between the first trench 7 and the second trench 27. In contrast to this, in the present third preferred embodiment, as shown in FIGS. 26 to 28, the inside of the second trench 27 is connected to the trench contact TC (the first trench contact portion TCa and the second trench contact portion TCb). In other words, the trench contact TC is provided to lie astride the mesa region and the second trench 27. Further, the second trench 27 is the dummy trench D in FIGS. 26 to 28 but may be the active trench A. In a case where the second trench 27 is the active trench A, an insulating film such as an oxide film or the like may be provided between the trench contact TC and the active portion so that the trench contact TC should not be electrically connected to the active portion of the second trench 27.

Summary of the Third Preferred Embodiment

Since the trench contact TC is connected to the inside of the second trench 27, even if the distance between the first trench 7 and the second trench 27 is not made larger, the distance between the first trench 7 and the trench contact TC can be increased. It is thereby possible to achieve the channel region C in which the adverse effect on the ON-state characteristics due to the p$^+$-type contact layer 3 is further suppressed. Further, since the mesa width can be reduced, it is possible to reduce the ON-state voltage.

<Variation 3-1>

Figure 29:
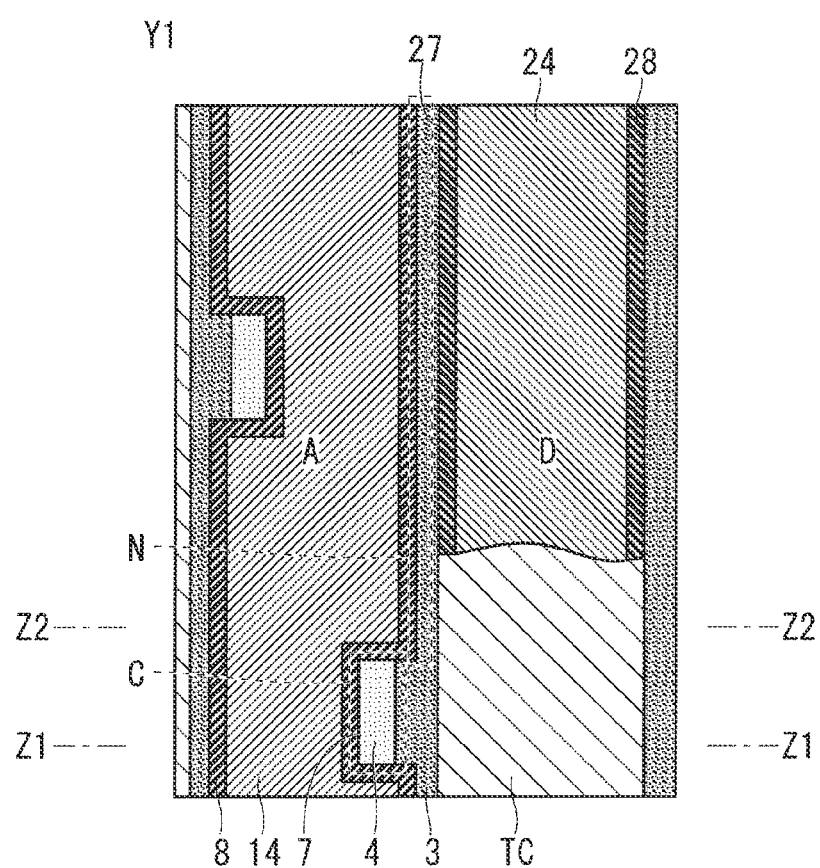
FIG. 29 is a plan view taken along the line Y1-Y1, showing a structure of a semiconductor device in accordance with a variation 3-1.
Figure 30:
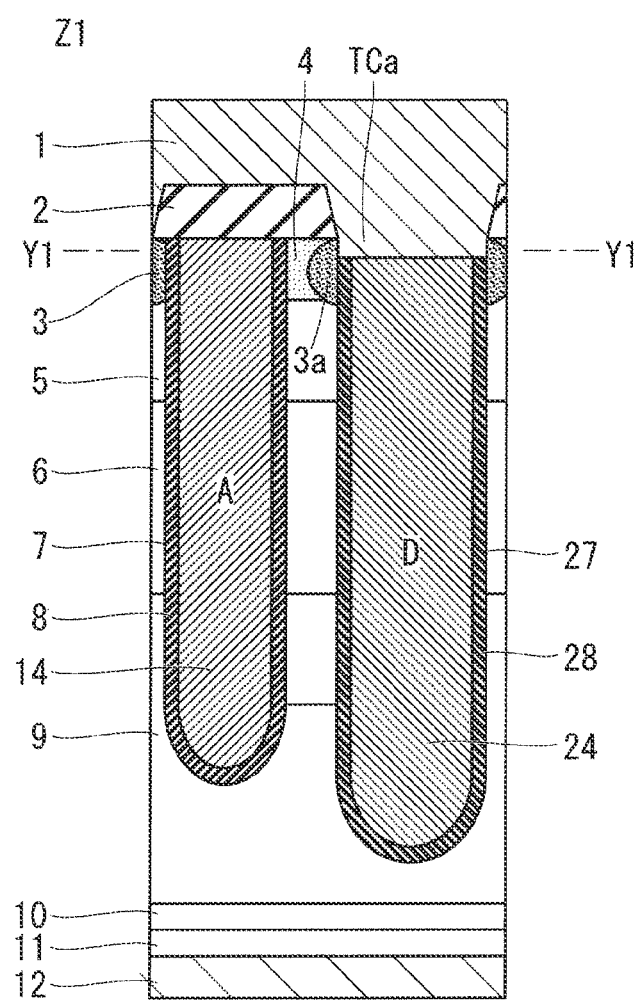
FIG. 30 is a cross section taken along the line Z1-Z1, showing the structure of the semiconductor device in accordance with the variation 3-1.
Figure 31:
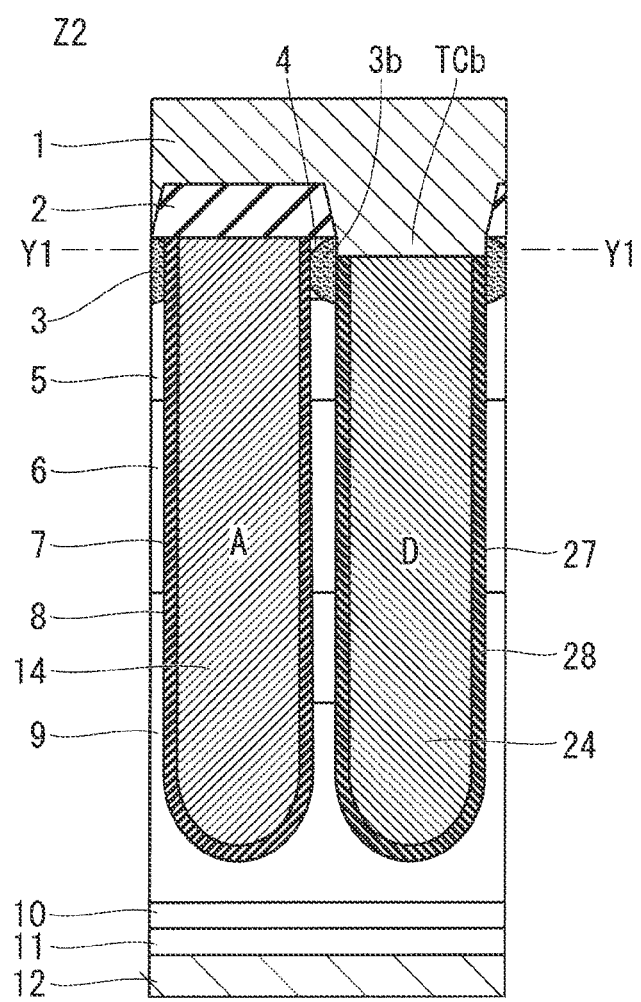
FIG. 31 is a cross section taken along the line Z2-Z2, showing the structure of the semiconductor device in accordance with the variation 3-1.
Figure 32:
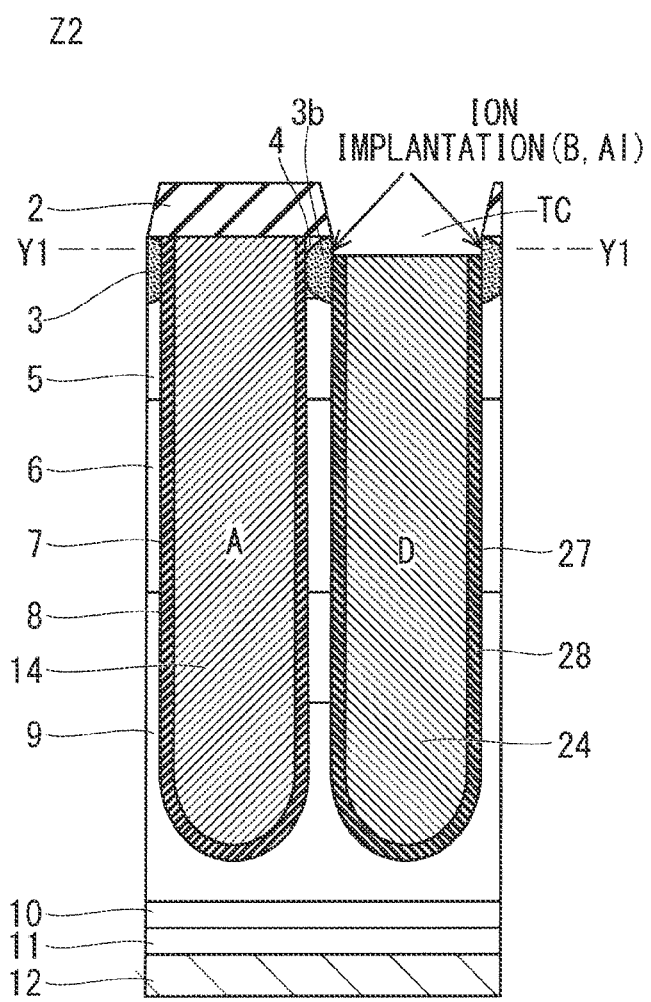
FIG. 32 is a cross section taken along the line Z2-Z2, for explaining a method of manufacturing the semiconductor device in accordance with the variation 3-1.

In the third preferred embodiment, though the trench contact TC is provided to lie astride the mesa region and the second trench 27, this is only one exemplary case. As shown in FIGS. 29 to 31, the trench contact TC (the first trench contact portion TCa and the second trench contact portion TCb) may be provided inside the second trench 27 in a plan view. In other words, as shown in FIGS. 30 and 31, both ends of the trench contact TC and both ends of the second trench 27 may be flush with each other. Further, as shown in FIG. 32, the p$^+$-type contact layer 3 may be formed on a sidewall of the trench contact TC and therebelow by diagonal ion implantation. Furthermore, by providing the first trench 7 with a taper which is tapered downward, the p$^+$-type contact layer 3 can be formed even by ion implantation which is performed almost perpendicularly to the semiconductor substrate.

<Summary of Variation 3-1>

Since the trench contact TC is provided inside the second trench 27 in a plan view, it is possible to further increase the distance between the first trench 7 and the trench contact TC. It is thereby possible to achieve the channel region C in which the adverse effect on the ON-state characteristics due to the p$^+$-type contact layer 3 is further suppressed. Further, since the mesa width can be further reduced, it is possible to further reduce the ON-state voltage.

<Variation 3-2>

Figure 33:
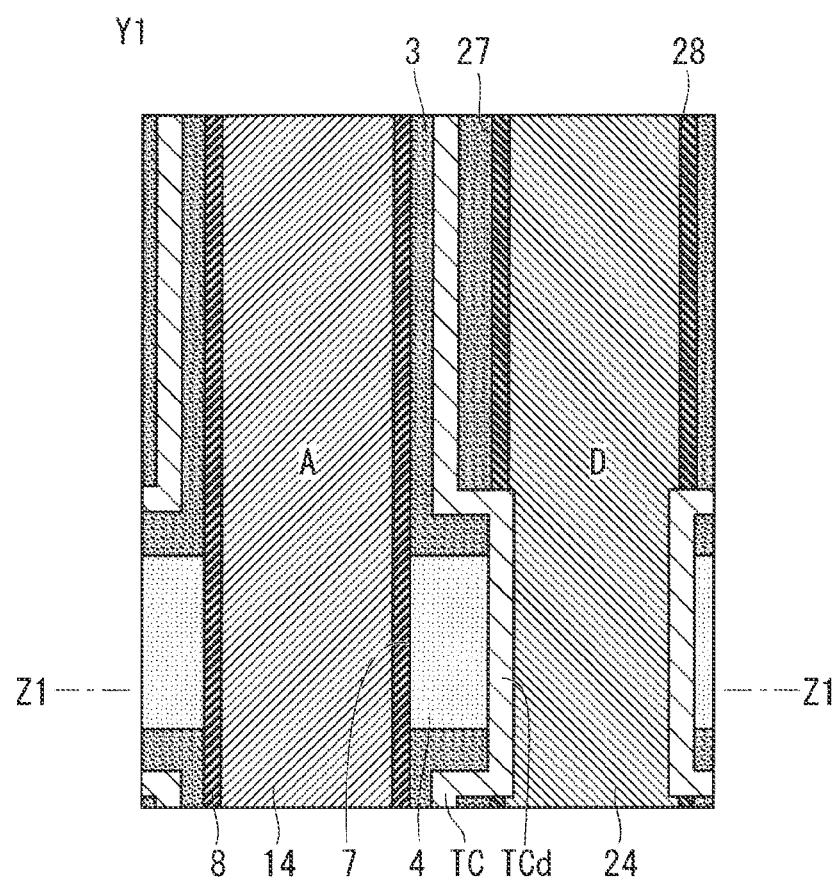
FIG. 33 is a plan view taken along the line Y1-Y1, showing a structure of a semiconductor device in accordance with a variation 3-2.
Figure 34:
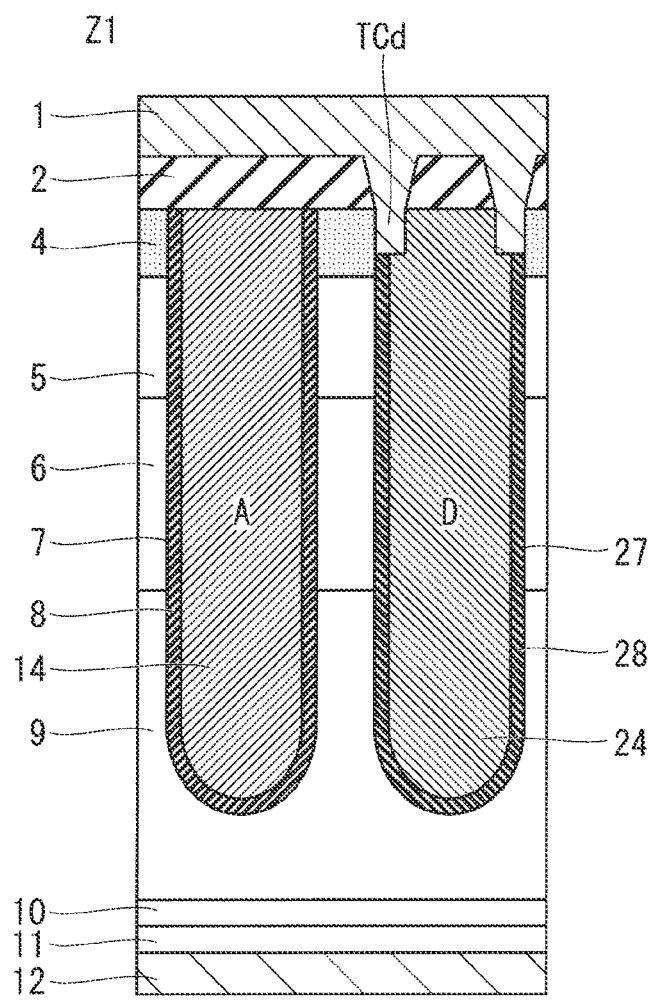
FIG. 34 is a cross section taken along the line Z1-Z1, showing the structure of the semiconductor device in accordance with the variation 3-2.

As shown in FIGS. 33 and 34, the trench contact TC may include a third trench contact portion TCd which is not connected to the p$^+$-type contact layer 3 (the first p$^+$-type contact layer 3a and the second p$^+$-type contact layer 3b) but connected to the n$^+$-type source layer 4 and the inside of the second trench 27. Specifically, by bending the trench contact TC, a portion of the trench contact TC, which is adjacent to the channel region C, may be formed inside the second trench 27. Further, the portion of the trench contact TC, which is adjacent to the channel region C, may be provided to lie astride the mesa region and the second trench 27.

<Summary of Variation 3-2>

According to the structure described above, since the p$^+$-type contact layer 3 is not provided below the trench contact TC in the channel region C, it is possible to suppress the adverse effect on the ON-state characteristics due to the p$^+$-type contact layer 3.

<Variation 3-3>

In the first preferred embodiment, by performing general-type self-aligned implantation into the trench contact TC, the p$^+$-type contact layer 3 is formed. In contrast to this, like in the variation 3-2 shown in FIGS. 33 and 34, the n$^+$-type source layer 4 may be formed by self-aligned implantation including diagonal ion implantation from the trench contact TC (third trench contact portion TCd) connected to the n$^+$-type source layer 4. Similarly, the p-type base layer 5 may be formed by self-aligned implantation including diagonal ion implantation. Also similarly, the n-type carrier accumulation layer 6 may be formed by self-aligned implantation including diagonal ion implantation. Hereinafter, this will be described with reference to FIGS. 35A and 35B to 38A and 38B.

Figure 35A:
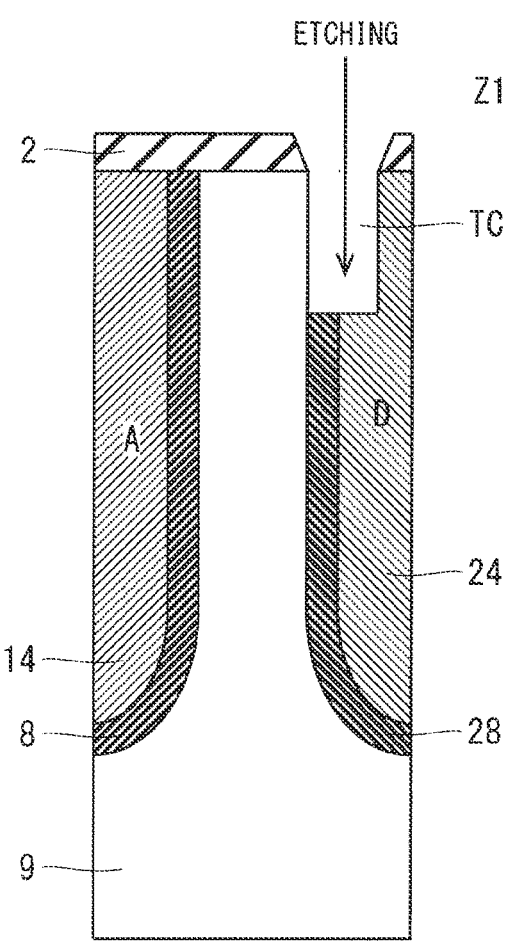
FIGS. 35A and 35B are cross sections each used for explaining a method of manufacturing a semiconductor device in accordance with a variation 3-3.
Figure 35B:
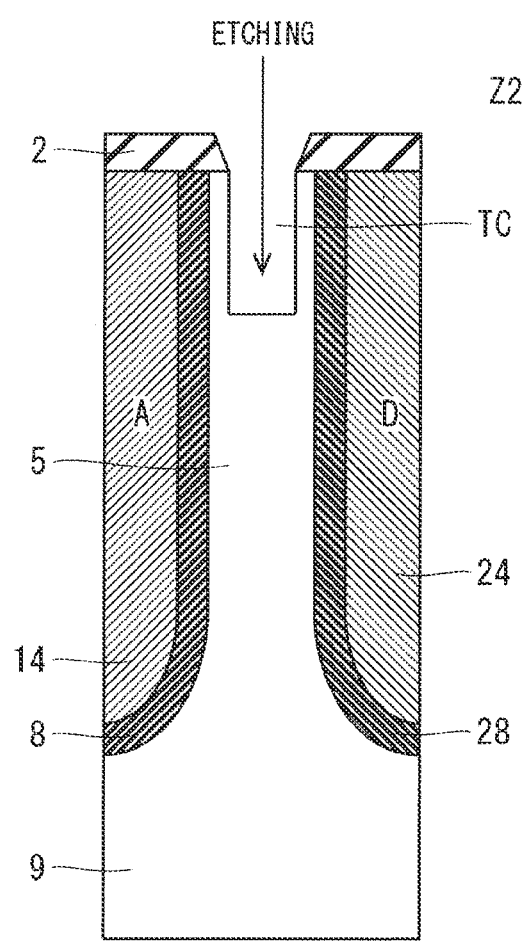

First, as shown in FIGS. 35A and 35B, the trench contact TC is formed by etching polysilicon which is to become the active portion 14 and the dummy portion 24 and the gate oxide film 8 by dry etching or wet etching.

Figure 36A:
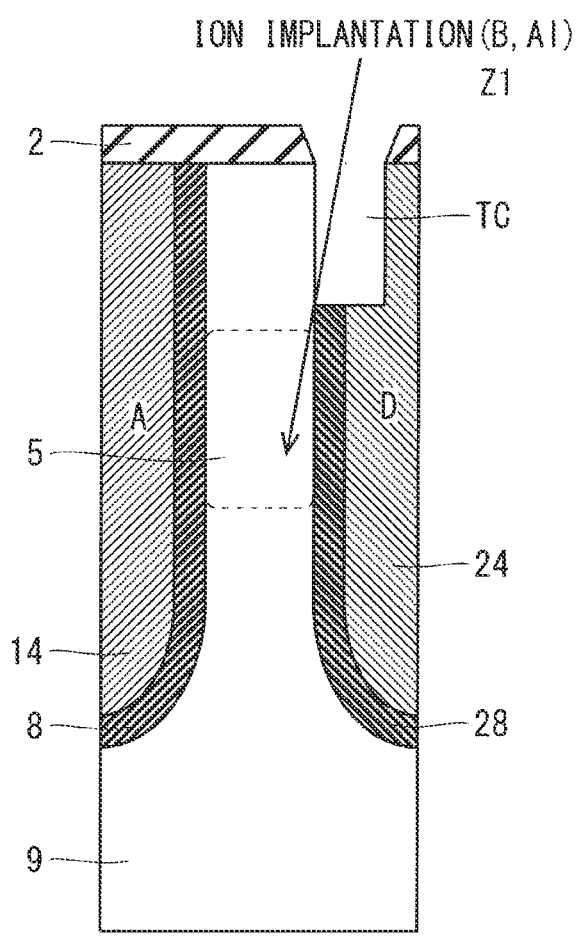
FIGS. 36A and 36B are cross sections each used for explaining the method of manufacturing the semiconductor device in accordance with the variation 3-3.
Figure 36B:
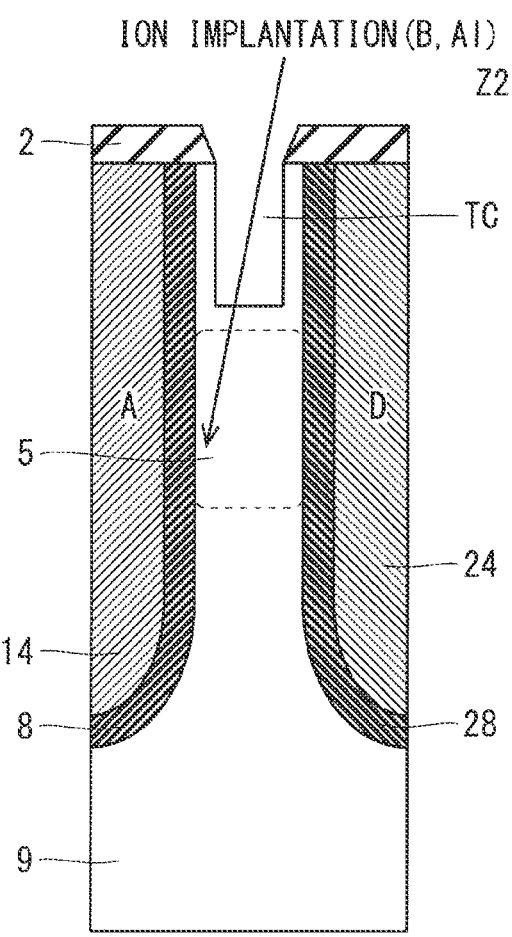
Figure 37A:
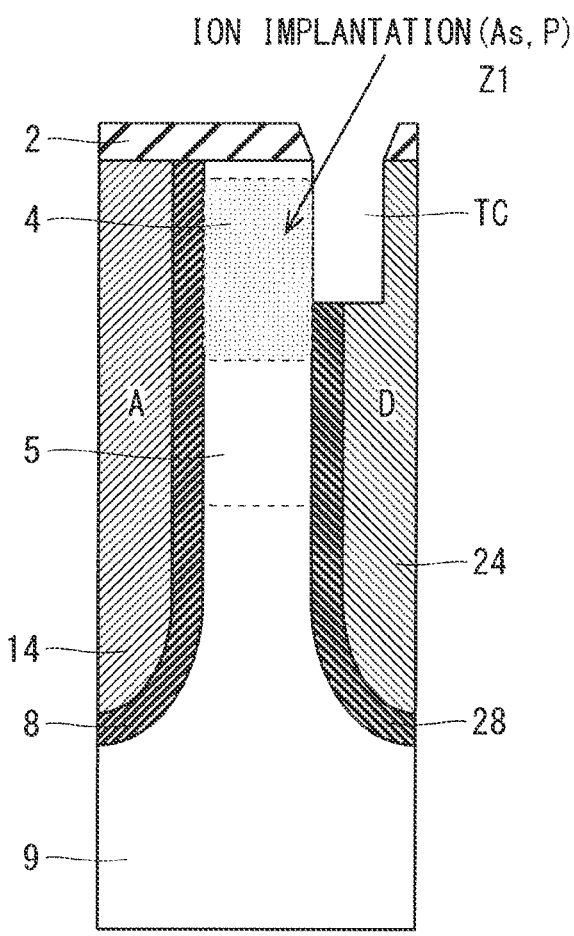
FIGS. 37A and 37B are cross sections each used for explaining the method of manufacturing the semiconductor device in accordance with the variation 3-3.
Figure 37B:
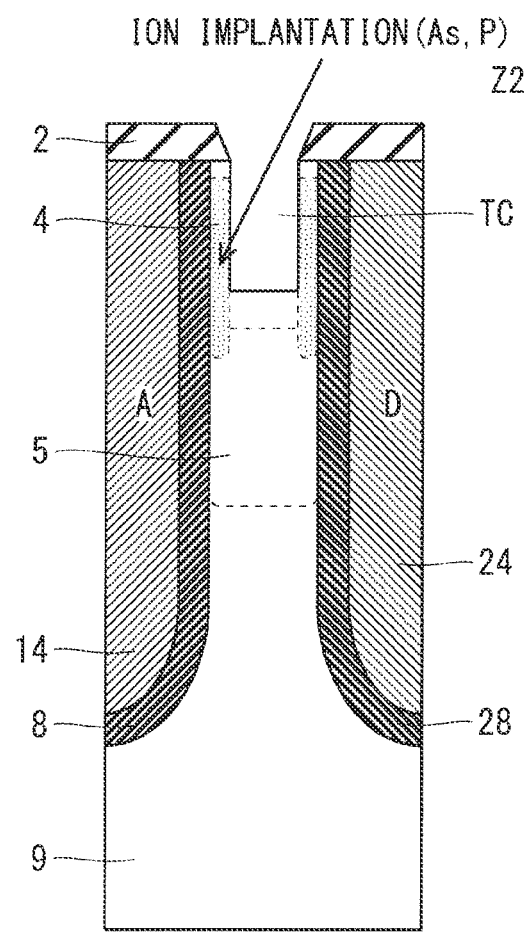
Figures 38A, 38B:
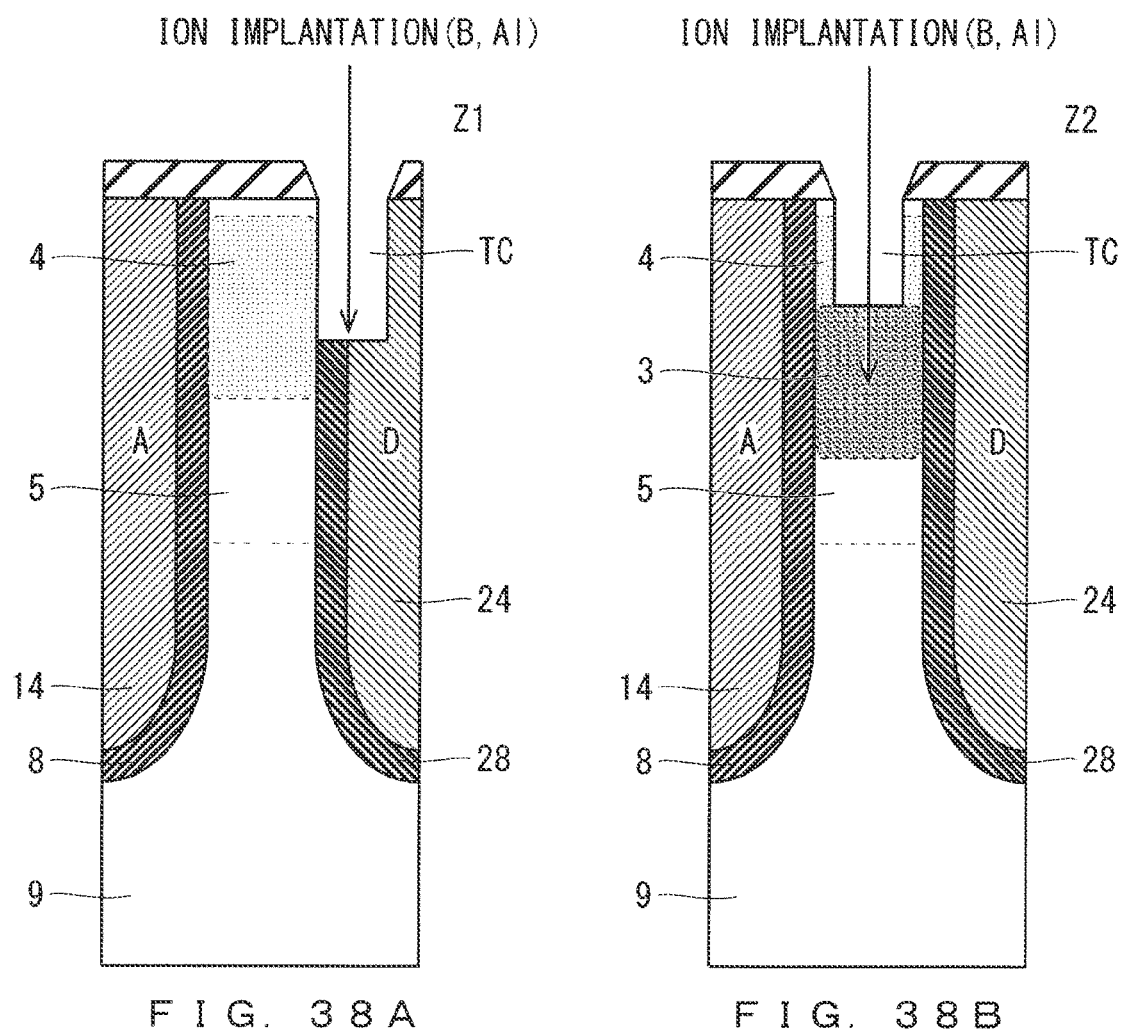
FIGS. 38A and 38B are cross sections each used for explaining the method of manufacturing the semiconductor device in accordance with the variation 3-3.

Next, as shown in FIGS. 36A and 36B, the p-type base layer 5 is formed by self-aligned implantation including diagonal ion implantation from the trench contact TC. Next, as shown in FIGS. 37A and 37B, the n$^+$-type source layer 4 is formed by self-aligned implantation including diagonal ion implantation from the trench contact TC. Then, as shown in FIGS. 38A and 38B, the p$^+$-type contact layer 3 is formed below the trench contact TC in the mesa region by self-aligned implantation from the trench contact TC.

Though formation of the n-type carrier accumulation layer 6 is not described above, like in the formation of the n$^+$-type source layer 4 and the p-type base layer 5, the n-type carrier accumulation layer 6 can be formed by self-aligned implantation including diagonal ion implantation from the trench contact TC.

<Summary of Variation 3-3>

Since the n$^+$-type source layer 4, the p-type base layer 5, and the n-type carrier accumulation layer 6 are formed by self-aligned implantation including diagonal ion implantation from the trench contact TC, the photolithography process for forming the n$^+$-type source layer 4, the p-type base layer 5, and the n-type carrier accumulation layer 6 can be eliminated. As this result, the manufacturing cost can be reduced.

Herein, assumed is a case where the manufacturing method of the present variation 3-3 is applied to the structure of the variation 3-2 shown in FIGS. 33 and 34 in which the second trench 27 is present below the trench contact TC and the ions for forming the p$^+$-type contact layer 3 are implanted almost perpendicularly into the semiconductor substrate. In this case, since the formation of the p$^+$-type contact layer 3 in the channel region C adjacent to the second trench 27 is suppressed, it is possible to achieve the channel region C in which the adverse effect on the ON-state characteristics due to the p$^+$-type contact layer 3 is suppressed.

Further, herein, though the case has been described where the manufacturing method of the present variation 3-3 is applied to the structure of the variation 3-2 shown in FIGS. 33 and 34 in order to suppress the adverse effect on the ON-state characteristics due to the p$^+$-type contact layer 3, this is only one exemplary case. For example, the manufacturing method of the present variation 3-3 may be applied to the structure of the first preferred embodiment (FIGS. 1 to 4) in which the width of the first trench 7 is partially changed, or may be applied to the structure of the second preferred embodiment (FIG. 16) in which the trench contact TC is bent.

<Variation 3-4>

Figure 39:
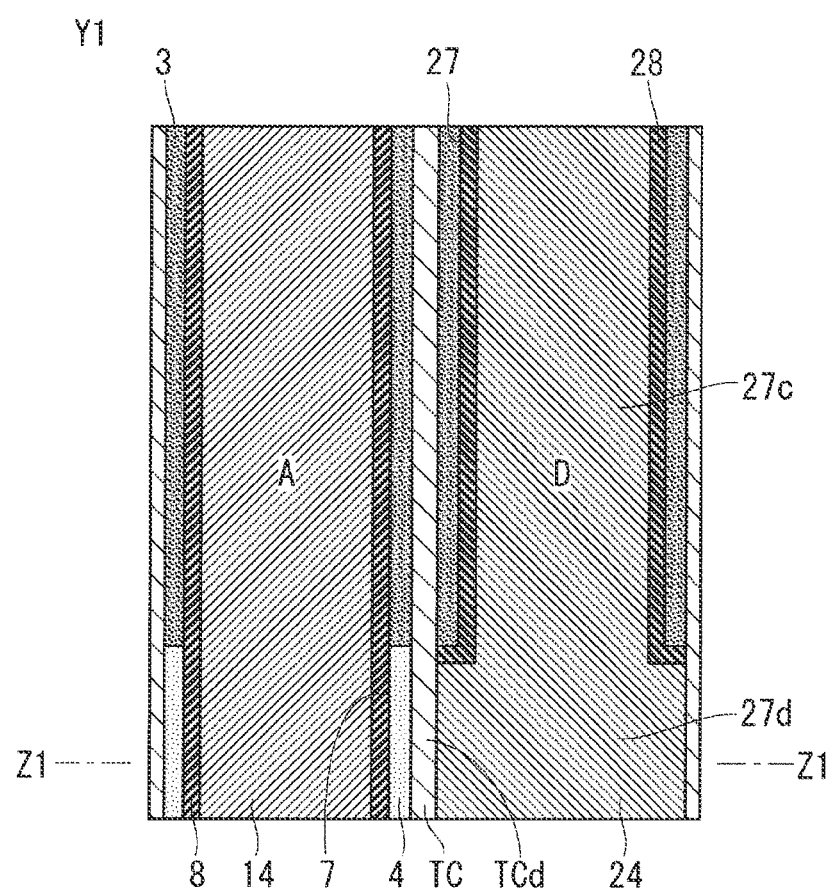
FIG. 39 is a plan view taken along the line Y1-Y1, showing a structure of a semiconductor device in accordance with a variation 3-4.
Figure 40:
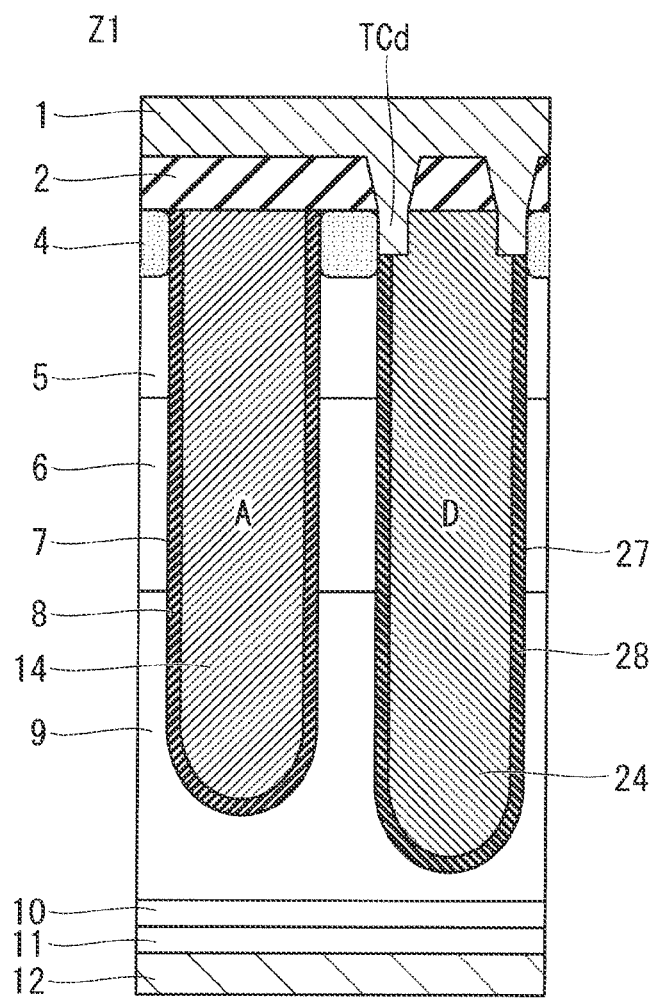
FIG. 40 is a cross section taken along the line Z1-Z1, showing the structure of the semiconductor device in accordance with the variation 3-4.

As shown in FIG. 39, the second trench 27 may include a first portion 27c separated from the third trench contact portion TCd and a second portion 27d connected to the third trench contact portion TCd. The third trench contact portion TCd herein is like that of the variation 3-2 and is a portion of the trench contact TC, which is not connected to the p$^+$-type contact layer 3 but connected to the n$^+$-type source layer 4 and the inside of the second trench 27, as shown in FIG. 40.

In such a structure, as shown in FIG. 39, the width of the second portion 27d may be larger than that of the first portion 27c. Specifically, there may be a structure in which the second trench 27 protrudes in the width direction and the trench contact TC is partially provided in the protruding portion.

<Summary of Variation 3-4>

According to the structure as described in the present variation 3-4 in which the second trench 27 protrudes, it is possible to reduce the distance between the trench contact TC and the active trench A. Therefore, by performing the self-aligned implantation including the diagonal ion implantation, it is possible to more easily form the structure in which the n⁺-type source layer 4 is in contact with the active trench A.

The Fourth Preferred Embodiment

The semiconductor device may include a sense cell, besides a main cell, which has a function of sensing an abnormality in occurrence of the short circuit to protect the main cell. In this case, from the viewpoint of preventing a malfunction, it is preferable that the threshold voltage Vth of the sense cell should be higher than that of the main cell. Then, in the present fourth preferred embodiment, as to the distance between the first side portion of the first trench 7 and the first trench contact portion TCa of the trench contact TC, the distance in the sense cell is made smaller than that in the main cell.

Summary of the Fourth Preferred Embodiment

According to the structure described above, since the threshold voltage Vth of the sense cell can be made higher than that of the main cell, it is possible to suppress the malfunction of the semiconductor device.

The Fifth Preferred Embodiment

Figure 41:
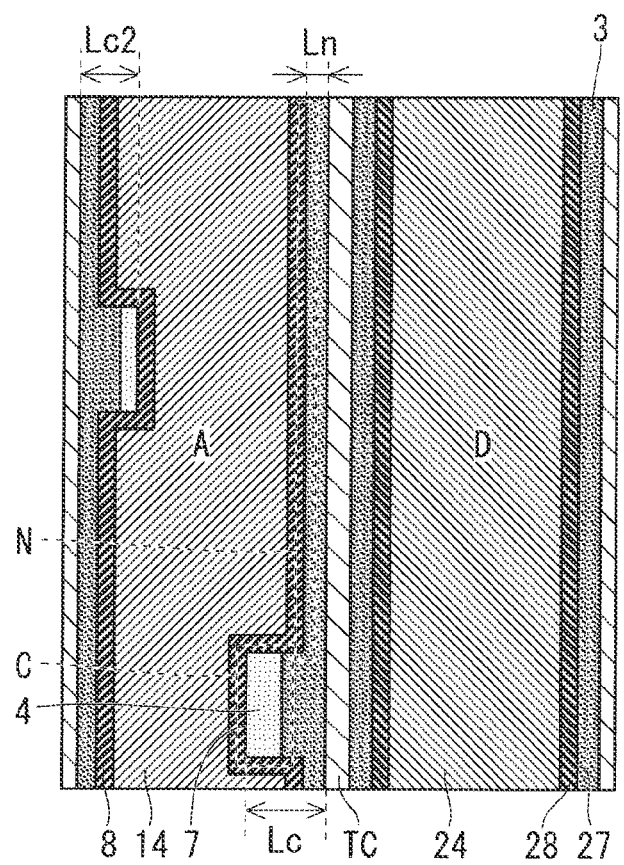
FIG. 41 is a plan view showing a structure of a semiconductor device in accordance with a fifth preferred embodiment.

FIG. 41 is a plan view showing a structure of a semiconductor element 100 included in a semiconductor device in accordance with the fifth preferred embodiment. In the present fifth preferred embodiment, like in the first preferred embodiment, a plurality of channel regions, such as channel regions C and C2, are provided by providing a plurality of pairs of the first side portion and the first p⁺-type contact layer 3a with respect to one first trench 7.

Then, the distance Lc between the first side portion and the first p⁺-type contact layer 3a in one pair is different from the distance Lc2 between the first side portion and the first p⁺-type contact layer 3a in another pair. In the exemplary case of FIG. 41, the distance Lc2 in the channel region C2 is smaller than the distance Lc in the channel region C and larger than the distance Ln between the second side portion and the second p⁺-type contact layer 3b in the non-channel region N.

Summary of the Fifth Preferred Embodiment

According to the present fifth preferred embodiment described above, it is possible to make the threshold voltage Vth of the channel region C2 higher than the threshold voltage Vth of the channel region C. Since the channel region C2 having a higher threshold voltage Vth is turned off earlier than the channel region C at a turn-off and the electron injection amount is reduced, it is possible to reduce the carrier density inside the n-type drift layer 9. For this reason, the switching time at the turn-off of the channel region C having a lower threshold voltage Vth can be made shorter, and the turn-off power loss can be reduced.

The Sixth Preferred Embodiment

Figure 42:
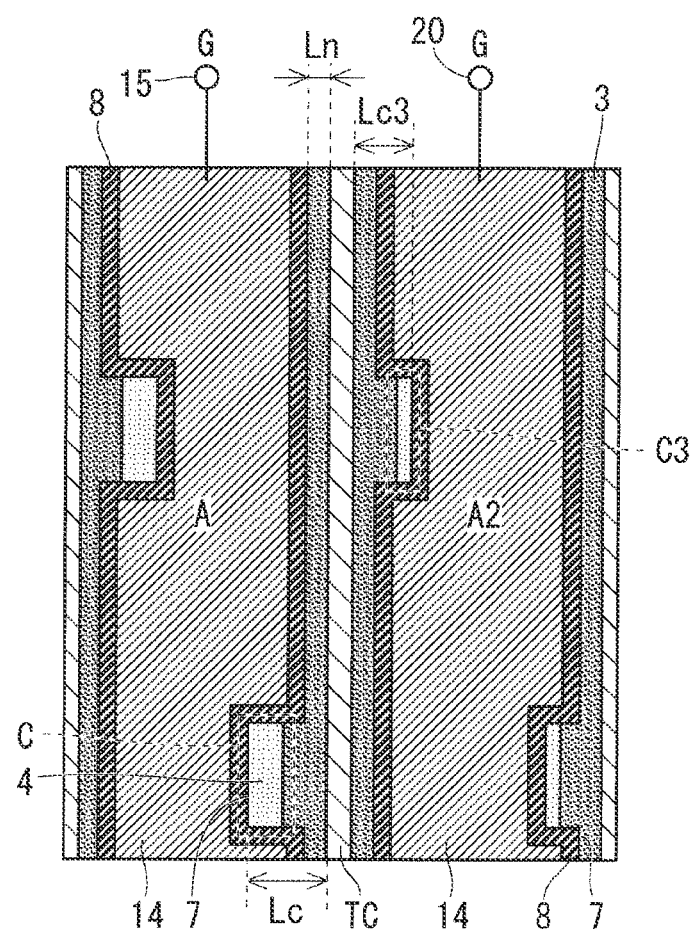
FIG. 42 is a plan view showing a structure of a semiconductor device in accordance with a sixth preferred embodiment.

FIG. 42 is a plan view showing a structure of a semiconductor element 100 included in a semiconductor device in accordance with the sixth preferred embodiment. In the present sixth preferred embodiment, provided are a plurality of first trenches 7 which are a plurality of active trenches, such as active trenches A and A2. Further, the active portion 14 of the active trench A is connected to the gate electrode 15, and the active portion 14 of the active trench A2 is connected to a gate electrode 20.

Herein, as a double gate drive for turning on and turning off the two gate electrodes 15 and 20 at different timings, performed is a drive for turning off the gate electrode 20 earlier and turning off the gate electrode 15 later. In such a double gate drive, during a control period which is a switching time for cutting off the gate electrode 20, the ON-state voltage increases since energization is made only by the channel of the active trench A connected to the gate electrode 15. For this reason, the control period should be shorter, and in order to achieve this, the threshold voltage Vth of the active trench A2 should be made higher so that the amount of electrons to be injected in the active trench A2 connected to the gate electrode 20 may be made smaller.

In consideration of this, in the present sixth preferred embodiment, the distance Lc between the first side portion of one active trench A (first trench 7) and the first p⁺-type contact layer 3a is different from the distance Lc3 between the first side portion of another active trench A2 (first trench 7) and the first p⁺-type contact layer 3a. In the exemplary case of FIG. 42, the distance Lc3 of the channel region C3 in the active trench A2 is smaller than the distance Lc of the channel region C in the active trench A. More preferably, the area of the channel region C3 in the active trench A2 is smaller than that of the channel region C in the active trench A.

Summary of the Sixth Preferred Embodiment

According to the present sixth preferred embodiment described above, the threshold voltage Vth of the active trench A2 connected to the gate electrode 20 becomes higher than the threshold voltage Vth of the active trench A connected to the gate electrode 15. Therefore, the control period at the double gate drive can be made shorter, and the turn-off power loss can be reduced.

<Other Variation 1>

The active portion 14 described in the first to sixth preferred embodiments may be used for a gate of an RC-IGBT (Reverse Conducting IGBT). In other words, the semiconductor element 100 of the first to sixth preferred embodiments may be an RC-IGBT.

Further, the area of the p⁺-type contact layer 3 below the trench contact TC in a diode region of the RC-IGBT may be smaller than that of the p⁺-type contact layer 3 below the trench contact TC in an IGBT region of the RC-IGBT. The p⁺-type contact layer 3 herein includes the first p⁺-type contact layer 3a and the second p⁺-type contact layer 3b.

Furthermore, as to the occupancy ratio of the trench contact TC provided inside the second trench 27 to the entire trench contact TC in a plan view, the occupancy ratio of the diode region may be larger than that of the IGBT region.

According to the structure described above, by providing the trench contact TC inside the second trench 27, it is possible to increase the contact area of the emitter electrode 1 while reducing the area of the p$^+$-type contact layer 3 inside the diode region. As this result, since the hole injection amount is reduced and the electron discharge amount increases, it is possible to reduce the recovery loss.

<Other Variation 2>

The active portion 14 described in the first to sixth preferred embodiments may be used for a gate of a MOSFET (Metal Oxide Semiconductor Field Effect Transistor). In other words, the semiconductor element 100 of the first to sixth preferred embodiments may be a MOSFET.

<Other Variation 3>

In the first to sixth preferred embodiments, though no description has been made on a semiconductor used for the semiconductor substrate or the like, this semiconductor may be silicon (Si) or a wide bandgap semiconductor. The wide bandgap semiconductor includes, for example, silicon carbide (SiC), a gallium nitride based material, gallium oxide, or diamond. According to such a structure, it is possible to increase the breakdown voltage of the semiconductor device. Further, sine the ions implanted into a SiC substrate are harder to be thermally diffused than those implanted into a Si substrate, the width of the p$^+$-type contact layer with respect to the trench contact in the SiC substrate is smaller than that of the p$^+$-type contact layer in the Si substrate. For this reason, the distance between the first side portion of the first trench and the p$^+$-type contact layer of the bottom portion of the trench contact in the SiC substrate is larger than that in the Si substrate. In other words, in the SiC substrate, the likelihood of the distance increases, in which the p$^+$-type contact layer has an adverse effect on the threshold voltage Vth. As this result, in the SiC substrate, since the distance between the first side portion and the trench contact can be made still smaller within a range in which no effect is produced on the threshold voltage Vth and the mesa width can be thereby made smaller, it is possible to further reduce the ON-state voltage.

Further, the preferred embodiments and the variations may be freely combined, or may be changed or omitted as appropriate.

While the disclosure has been shown and described in detail, the foregoing description is in all aspects illustrative and not restrictive. It is therefore understood that numerous modifications and variations can be devised.

What is claimed is:

1. A semiconductor device, comprising:
   a semiconductor substrate on which an emitter electrode and a gate electrode are provided;
   a base layer of a first conductivity type which is provided on an upper surface side of the semiconductor substrate;
   a source layer of a second conductivity type which is provided on the upper surface side of the base layer;
   an active portion which is provided on an insulating film which is an inner surface of a first trench penetrating the base layer and the source layer, the active portion being connected to the gate electrode;
   a first trench contact portion and a second trench contact portion provided to face a first side portion and a second side portion of the first trench, respectively, in a plan view, the emitter electrode being provided inside each of the first trench contact portion and the second trench contact portion;
   a first contact layer of the first conductivity type which is connected to a lower portion of the first trench contact portion and has an impurity concentration of the first conductivity type which is higher than that of the base layer;
   a second contact layer of the first conductivity type which is connected to a lower portion of the second trench contact portion and has an impurity concentration of the first conductivity type which is higher than that of the base layer; and
   a collector electrode provided on a lower surface of the semiconductor substrate,
   wherein the distance between the first side portion and the first trench contact portion is larger than that between the second side portion and the second trench contact portion in a plan view,
   the first contact layer is separated from the first side portion and the second contact layer is connected to the second side portion in a cross section, and
   an outline of the first trench in the first side portion has at least one of one or more concave shapes and convex shapes in a plan view.

2. The semiconductor device according to claim 1, wherein
   a trench contact including the first trench contact portion is bent toward the opposite side of the first side portion of the first trench in a plan view.

3. The semiconductor device according to claim 2, wherein
   a second trench which sandwiches the trench contact with the first trench in a plan view is provided, and
   the second trench includes:
   a first portion facing the first trench contact portion of the trench contact; and
   a second portion facing a portion of the trench contact other than the first trench contact portion and having a width larger than that of the first portion.

4. The semiconductor device according to claim 1, wherein
   the base layer and the source layer which are adjacent to the second side portion of the first trench are separated from each other by the second contact layer.

5. The semiconductor device according to claim 1, wherein
   the base layer and the source layer which are adjacent to the first side portion of the first trench are connected to each other.

6. The semiconductor device according to claim 1, wherein
   respective upper ends of the first contact layer and the second contact layer are connected to a lower end of the source layer.

7. The semiconductor device according to claim 1, wherein
   the first trench contact portion and the second trench contact portion do not face a third side portion of the first trench in a plan view.

8. The semiconductor device according to claim 7, wherein
   the base layer and the source layer which are adjacent to the third side portion of the first trench are connected to each other.

9. The semiconductor device according to claim 1, wherein
   a second trench is provided along the first trench in a plan view,
   the semiconductor device further comprising:

a third trench contact portion aligned with the first trench contact portion or the second trench contact portion in a width direction between the first trench and the second trench.

10. The semiconductor device according to claim 1, wherein
a second trench is provided along the first trench in a plan view, and
the first trench contact portion and the second trench contact portion are connected to the inside of the second trench.

11. The semiconductor device according to claim 10, wherein
the first trench contact portion and the second trench contact portion are provided inside the second trench in a plan view.

12. The semiconductor device according to claim 1, wherein
a second trench is provided along the first trench in a plan view,
the semiconductor device further comprising:
a third trench contact portion which is not connected to neither the first contact layer nor the second contact layer but connected to the source layer and the inside of the second trench.

13. The semiconductor device according to claim 12, wherein
the second trench includes:
a first portion separated from the third trench contact portion; and
a second portion which is connected to the third trench contact portion and has a width larger than that of the first portion.

14. A method of manufacturing the semiconductor device according to claim 12, wherein
the source layer is formed by self-aligned implantation including diagonal ion implantation from the third trench contact portion connected to the source layer.

15. The semiconductor device according to claim 1, wherein
a plurality of pairs of the first side portion and the first contact layer are provided with respect to one first trench, and
the distance between the first side portion and the first contact layer in one of the pairs is different from that between the first side portion and the first contact layer in another one of the pairs.

16. The semiconductor device according to claim 1, wherein
a plurality of the first trenches are provided, and
the distance between the first side portion of one of the first trenches and the first contact layer is different from that between the first side portion of another one of the first trenches and the first contact layer.

17. The semiconductor device according to claim 1, wherein
the active portion is used for a gate of an RC-IGBT.

18. The semiconductor device according to claim 17, wherein
the area of a contact layer including the first contact layer and the second contact layer in a diode region of the RC-IGBT is smaller than that of a contact layer including the first contact layer and the second contact layer in an IGBT region of the RC-IGBT.

19. The semiconductor device according to claim 1, wherein
the active portion is used for a gate of a MOSFET.

20. The semiconductor device according to claim 1, wherein
the semiconductor substrate includes a wide bandgap semiconductor.

21. A semiconductor device, comprising:
a semiconductor substrate on which an emitter electrode and a gate electrode are provided;
a base layer of a first conductivity type which is provided on an upper surface side of the semiconductor substrate;
a source layer of a second conductivity type which is provided on the upper surface side of the base layer;
an active portion which is provided on an insulating film which is an inner surface of a first trench penetrating the base layer and the source layer, the active portion being connected to the gate electrode;
a first trench contact portion and a second trench contact portion provided to face a first side portion and a second side portion of the first trench, respectively, in a plan view, the emitter electrode being provided inside each of the first trench contact portion and the second trench contact portion;
a first contact layer of the first conductivity type which is connected to a lower portion of the first trench contact portion and has an impurity concentration of the first conductivity type which is higher than that of the base layer;
a second contact layer of the first conductivity type which is connected to a lower portion of the second trench contact portion and has an impurity concentration of the first conductivity type which is higher than that of the base layer; and
a collector electrode provided on a lower surface of the semiconductor substrate,
wherein the distance between the first side portion and the first trench contact portion is larger than that between the second side portion and the second trench contact portion in a plan view,
the first contact layer is separated from the first side portion and the second contact layer is connected to the second side portion in a cross section, and
the width of the first trench in the first side portion is smaller than that of the first trench in the second side portion in a plan view.

22. The semiconductor device according to claim 21, wherein
the difference between the width in the first side portion and that in the second side portion is larger than each of the width of the first trench contact portion and that of the second trench contact portion.

23. The semiconductor device according to claim 21, wherein
the depth of the first trench in the second side portion is larger than that of the first trench in the first side portion.

24. A semiconductor device, comprising:
a semiconductor substrate on which an emitter electrode and a gate electrode are provided;
a base layer of a first conductivity type which is provided on an upper surface side of the semiconductor substrate;
a source layer of a second conductivity type which is provided on the upper surface side of the base layer;
an active portion which is provided on an insulating film which is an inner surface of a first trench penetrating the base layer and the source layer, the active portion being connected to the gate electrode;

a first trench contact portion and a second trench contact portion provided to face a first side portion and a second side portion of the first trench, respectively, in a plan view, the emitter electrode being provided inside each of the first trench contact portion and the second trench contact portion;

a first contact layer of the first conductivity type which is connected to a lower portion of the first trench contact portion and has an impurity concentration of the first conductivity type which is higher than that of the base layer;

a second contact layer of the first conductivity type which is connected to a lower portion of the second trench contact portion and has an impurity concentration of the first conductivity type which is higher than that of the base layer; and a collector electrode provided on a lower surface of the semiconductor substrate, wherein the distance between the first side portion and the first trench contact portion is larger than that between the second side portion and the second trench contact portion in a plan view, the first contact layer is separated from the first side portion and the second contact layer is connected to the second side portion in a cross section, and the first trench is bent to be dented in the first side portion in a plan view.

\* \* \* \* \*